(12) United States Patent
Cambou et al.

(10) Patent No.: US 9,395,209 B2
(45) Date of Patent: Jul. 19, 2016

(54) MAGNETIC LOGIC UNITS CONFIGURED TO MEASURE MAGNETIC FIELD DIRECTION

(71) Applicant: Crocus Technology Inc., Santa Clara, CA (US)

(72) Inventors: Bertrand F. Cambou, Palo Alto, CA (US); Douglas J. Lee, San Jose, CA (US); Ken Mackay, Le Sappey en Chartreuse (FR); Barry Hoberman, Cupertino, CA (US)

(73) Assignee: Crocus Technology Inc., Santa Clara, CA (US)

( * ) Notice: Subject to any disclaimer, the term of this patent is extended or adjusted under 35 U.S.C. 154(b) by 0 days.

(21) Appl. No.: 14/552,326

(22) Filed: Nov. 24, 2014

(65) Prior Publication Data

US 2015/0077098 A1    Mar. 19, 2015

Related U.S. Application Data

(63) Continuation of application No. 13/787,585, filed on Mar. 6, 2013.

(60) Provisional application No. 61/608,015, filed on Mar. 7, 2012.

(51) Int. Cl.
*G01D 5/12*     (2006.01)
*G01B 7/30*     (2006.01)
(Continued)

(52) U.S. Cl.
CPC .. *G01D 5/12* (2013.01); *G01B 7/30* (2013.01); *G01C 17/02* (2013.01); *G01D 5/16* (2013.01); *G01R 33/0029* (2013.01); *G01R 33/096* (2013.01); *G01R 33/098* (2013.01)

(58) Field of Classification Search
CPC .... G01R 15/205; G01R 33/09; H01L 27/222; H01L 43/08
See application file for complete search history.

(56) References Cited

U.S. PATENT DOCUMENTS 5,168,461 A * 12/1992 Wu .................... H03H 19/002
                                                        708/819
6,693,486 B1 * 2/2004 Brockhaus ................ G01F 1/60
                                                        330/124 R
(Continued)

FOREIGN PATENT DOCUMENTS

CN    201697638 U    1/2011
CN    201748938 U    2/2011

OTHER PUBLICATIONS

Carter et al. "Reconfigurable Magnetoelectronic Circuits for Threshold Logic", International Journal of Circuit Theory and Applications, vol. 32, Dec. 2004, pp. 363-382 [retrieved on Apr. 23, 2013 ] Retrieved from the Internet <URL:http://www.crhc.illinois.edu/UCA/magneto/home/ckt_theory.pdf>, entire document, especially section 4.2, para 1, 2, 7.

(Continued)

*Primary Examiner* — Tung X Nguyen
*Assistant Examiner* — Feba Pothen
(74) *Attorney, Agent, or Firm* — Cooley LLP

(57) ABSTRACT

An apparatus includes circuits, a field line configured to generate a magnetic field based on an input, a sensing module configured to determine a parameter of each circuit, and a magnetic field direction determination module configured to determine an angular orientation of the apparatus relative to an external magnetic field based on the parameter. Each circuit includes multiple magnetic tunnel junctions. Each magnetic tunnel junction includes a storage layer having a storage magnetization direction and a sense layer having a sense magnetization direction configured based on the magnetic field. Each magnetic tunnel junction is configured such that the sense magnetization direction and a resistance of the magnetic tunnel junction vary based on the external magnetic field. The parameter varies based on the resistances of the multiple magnetic tunnel junctions. The magnetic field direction determination module is implemented in at least one of a memory or a processing device.

23 Claims, 17 Drawing Sheets

(51) Int. Cl.
*G01R 33/09* (2006.01)
*G01C 17/02* (2006.01)
*G01D 5/16* (2006.01)
*G01R 33/00* (2006.01)

(56) References Cited

U.S. PATENT DOCUMENTS

| | | | |
|---|---|---|---|
| 2005/0083733 A1 | 4/2005 | Bhattacharyya et al. | |
| 2005/0104104 A1* | 5/2005 | Schultz | H01L 21/8213 257/295 |
| 2005/0180203 A1* | 8/2005 | Lin | G11C 11/16 365/171 |
| 2007/0153572 A1 | 7/2007 | Boeve | |
| 2008/0205110 A1* | 8/2008 | Boeve | G11C 11/15 365/5 |
| 2008/0272771 A1 | 11/2008 | Guo | |
| 2009/0251960 A1 | 10/2009 | Schultz et al. | |
| 2010/0007367 A1 | 1/2010 | Spielberger et al. | |
| 2010/0067148 A1 | 3/2010 | Tsuchiya et al. | |
| 2010/0289490 A1* | 11/2010 | Fan | B82Y 25/00 324/260 |
| 2011/0007561 A1* | 1/2011 | Berger | G11C 11/16 365/171 |
| 2011/0044099 A1* | 2/2011 | Dieny | B82Y 25/00 365/171 |
| 2011/0212840 A1* | 9/2011 | Hong | G01R 33/3815 505/150 |
| 2012/0007598 A1 | 1/2012 | Lo et al. | |
| 2013/0070521 A1* | 3/2013 | El Baraji | G11C 11/16 365/158 |
| 2013/0106410 A1* | 5/2013 | Liu | G01R 33/0029 324/246 |

OTHER PUBLICATIONS

Prejbeanu et al. "Thermally Assisted MRAM", Journal of Physics: Condensed Matter, vol. 19, No. 16, 2007, [retrieved on Apr. 18, 2013]Retrieved from the Internet <URL: http://www.crocus-technology.com/pdf/Prejbeanu_JPCM_special_issue_revised.pdf>, entire document.

Prejbeanu et al. (citation) "Thermally Assisted MRAM", Journal of Physics: Condensed Matter, vol. 19, No. 16, Apr. 2007 [online] [retrieved on Apr. 18, 2013 ] Retrieved from the Internet <URL: http:l/iopscience.iop.org/0953-8984/19/16/165218>, entire document, especially citation.

Prejbeanu et al. "Thermally Assisted MRAMs: Ultimate Scalability and Logic Functionalities", Journal of Physics D: Applied Physics, vol. 46, pp. 1-16, Published Jan. 31, 2013 [online] (retrieved on Apr. 22, 2013] Retrieved from the Internet: <URL: http://www .spintec. fr!IMG/pdf/thermally __assisted_mramsultirnate_scalability_ and_logic_functionalities_jpdap..:__2013.pdf>. entire document.

International Search Report and Written Opinion issued to International Patent Application No. PCT/US13/29411, May 23, 2013, 12 pgs.

Extended European Search Report issued to European Patent Application No. 13757552.8, Nov. 30, 2015, 14 pgs.

* cited by examiner

MAGNETIC LOGIC UNITS CONFIGURED TO MEASURE MAGNETIC FIELD DIRECTION

CROSS-REFERENCE TO RELATED APPLICATIONS

This application is a continuation application of U.S. application Ser. No. 13/787,585, filed Mar. 6, 2013, which claims the benefit of U.S. Provisional Application No. 61/608,015, filed on Mar. 7, 2012, the disclosure of which is incorporated herein by reference in its entirety.

FIELD OF THE INVENTION

The invention relates generally to magnetic logic units and, more particularly, to magnetic logic units configured to measure magnetic field direction.

BACKGROUND

The Earth's magnetic field is relatively small, with an average value on the order of 0.5 Oersted (Oe). In some devices, detecting the direction of the Earth's magnetic field is performed by first amplifying received magnetic fields using a magnetic field amplifier, locating the Earth's magnetic field, and determining the direction of the Earth's magnetic field. This amplification of the Earth's magnetic field can be costly. In addition, the magnetic field amplifier and other associated magnetics may be relatively large, which can result in compasses and/or magnetometers including these magnetics being implemented as multi-chip solutions.

It is against this background that a need arose to develop the magnetic logic units configured to measure magnetic field direction and related methods described herein.

SUMMARY OF THE INVENTION

One aspect of the invention relates to an apparatus including a plurality of circuits, a field line configured to generate a magnetic field based on an input, a sensing module configured to determine a parameter of each of the plurality of circuits, and a magnetic field direction determination module configured to determine an angular orientation of the apparatus relative to an external magnetic field based on the parameter of each of the plurality of circuits. Each of the plurality of circuits including multiple magnetic tunnel junctions. Each magnetic tunnel junction includes a storage layer having a storage magnetization direction and a sense layer having a sense magnetization direction. The sense magnetization direction of each magnetic tunnel junction is configured based on the magnetic field. Each magnetic tunnel junction is configured such that the sense magnetization direction and a resistance of the magnetic tunnel junction vary based on the external magnetic field. The parameter of each of the plurality of circuits varies based on the resistances of the multiple magnetic tunnel junctions included in each of the plurality of circuits. The magnetic field direction determination module is implemented in at least one of a memory or a processing device.

Other aspects and embodiments of the invention are also contemplated. The foregoing summary and the following detailed description are not meant to restrict the invention to any particular embodiment but are merely meant to describe some embodiments of the invention.

BRIEF DESCRIPTION OF THE DRAWINGS

For a better understanding of the nature and objects of some embodiments of the invention, reference should be made to the following detailed description taken in conjunction with the accompanying drawings.

DETAILED DESCRIPTION

Definitions

The following definitions apply to some of the aspects described with respect to some embodiments of the invention. These definitions may likewise be expanded upon herein.

As used herein, the singular terms "a," "an," and "the" include plural referents unless the context clearly dictates otherwise. Thus, for example, reference to an object can include multiple objects unless the context clearly dictates otherwise.

As used herein, the term "set" refers to a collection of one or more objects. Thus, for example, a set of objects can include a single object or multiple objects. Objects of a set also can be referred to as members of the set. Objects of a set can be the same or different. In some instances, objects of a set can share one or more common characteristics.

As used herein, the terms "substantially" and "substantial" refer to a considerable degree or extent. When used in conjunction with an event or circumstance, the terms can refer to instances in which the event or circumstance occurs precisely as well as instances in which the event or circumstance occurs to a close approximation, such as accounting for typical manufacturing tolerances or variability of the embodiments described herein.

As used herein, the term "adjacent" refers to being near or adjoining Adjacent objects can be spaced apart from one another or can be in actual or direct contact with one another. In some instances, adjacent objects can be formed integrally with one another.

As used herein, the terms "connect," "connected," and "connection" refer to an operational coupling or linking. Connected objects can be directly coupled to one another or can be indirectly coupled to one another, such as via another set of objects.

As used herein, the term "main group element" refers to a chemical element in any of Group IA (or Group 1), Group IIA (or Group 2), Group IIIA (or Group 13), Group IVA (or Group 14), Group VA (or Group 15), Group VIA (or Group 16), Group VIIA (or Group 17), and Group VIIIA (or Group 18). A main group element is also sometimes referred to as a s-block element or a p-block element.

As used herein, the term "transition metal" refers to a chemical element in any of Group IVB (or Group 4), Group VB (or Group 5), Group VIB (or Group 6), Group VIIB (or Group 7), Group VIIIB (or Groups 8, 9, and 10), Group IB (or Group 11), and Group IIB (or Group 12). A transition metal is also sometimes referred to as a d-block element.

As used herein, the term "rare earth element" refers to any of Sc, Y, La, Ce, Pr, Nd, Pm, Sm, Eu, Gd, Tb, Dy, Ho, Er, Tm, Yb, and Lu.

Detailed Description of Embodiments of the Invention

Figure 1:
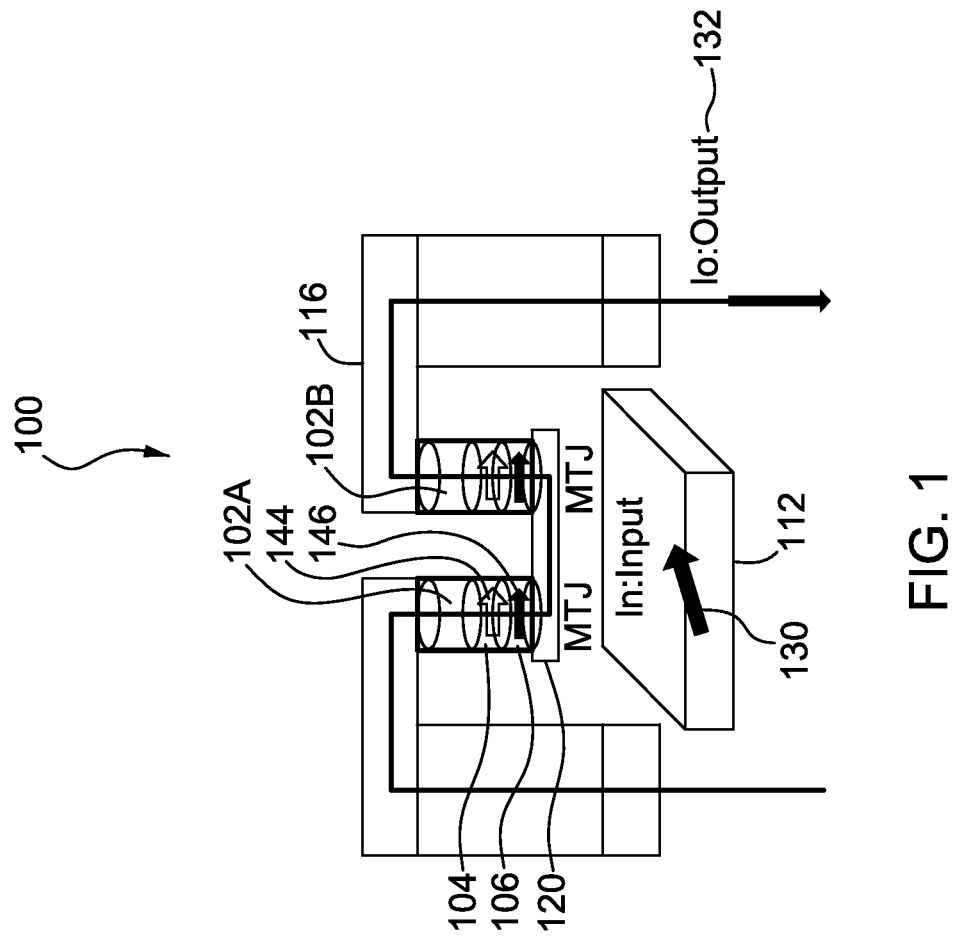
FIG. 1 illustrates a perspective view of a magnetic logic unit (MLU) amplification module, according to an embodiment of the invention.
Figure 2:
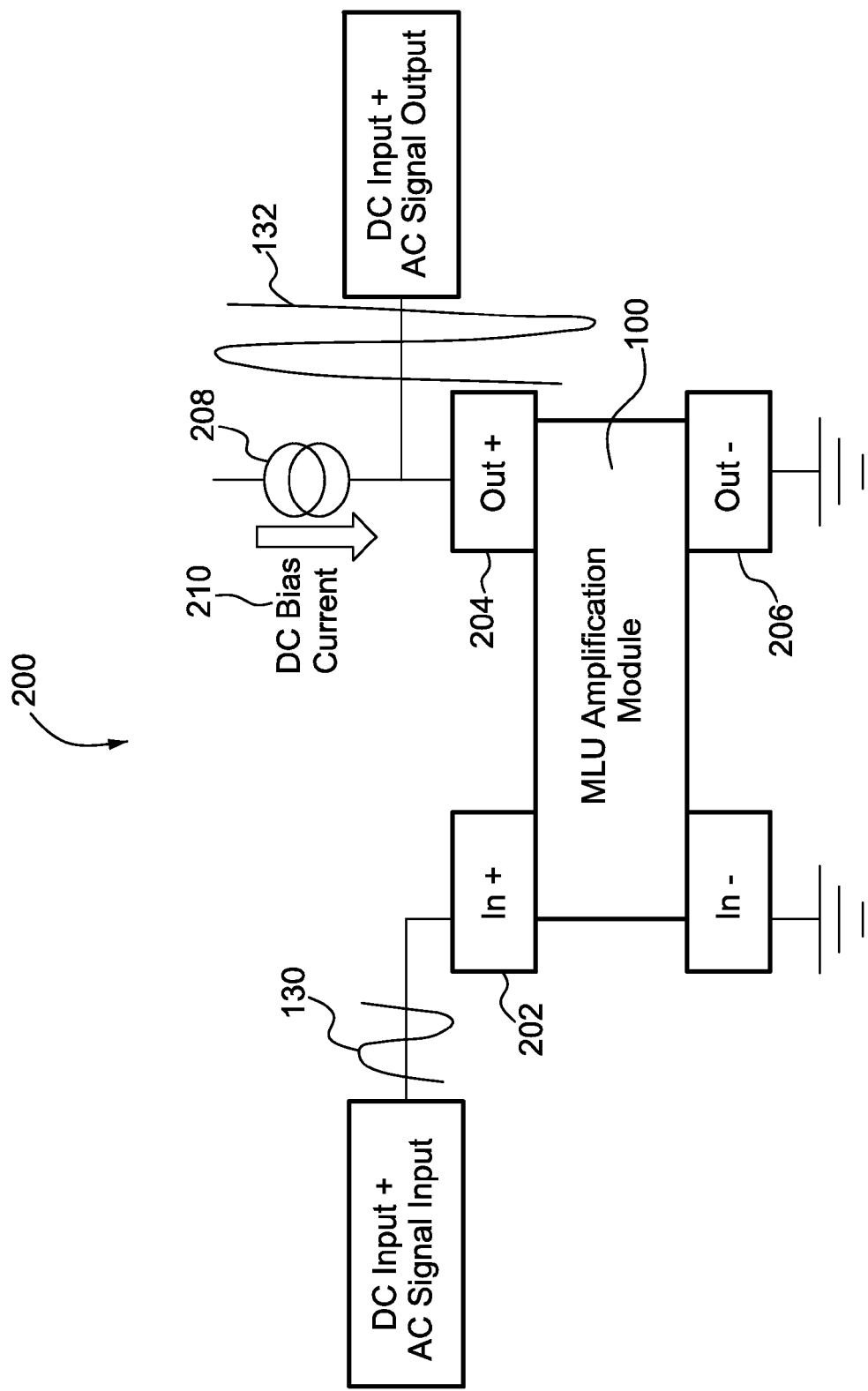
FIG. 2 illustrates a logical block diagram of an MLU-based amplifier including the MLU amplification module, according to an embodiment of the invention.
Figure 3:
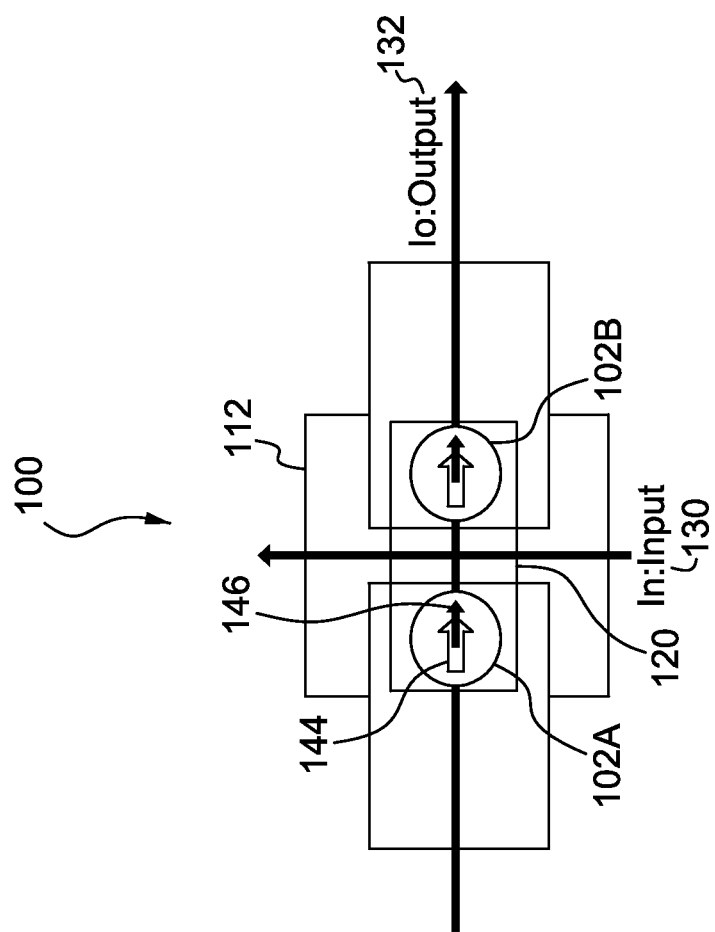
FIG. 3 illustrates a top view of the magnetic logic unit (MLU) amplification module corresponding to the perspective view of FIG. 1, according to an embodiment of the invention.

FIG. 1 illustrates a perspective view of a magnetic logic unit (MLU) amplification module 100, according to an embodiment of the invention. FIG. 2 illustrates a logical block diagram of an MLU-based amplifier 200 including the MLU amplification module 100, according to an embodiment of the invention. FIG. 3 illustrates a top view of the magnetic logic unit (MLU) amplification module 100 corresponding to the perspective view of FIG. 1, according to an embodiment of the invention. Referring to FIGS. 1 through 3, the MLU amplification module 100 may include one or more MLU's 102. In the embodiment of FIG. 1, MLU's 102A and 102B are shown connected by a conductive strap 120. MLU's may be implemented as magnetic tunnel junctions (MTJ's). An input signal 130 may be applied to the MLU-based amplifier 200 through a field line 112 that controls a first terminal 202 that modulates a resistance of each of the MLU's 102, and also a combined resistance of the MLU amplification module 100. For example, the input signal 130 may be an input current that flows through the field line 112, where the input current generates a magnetic field that couples to each of the MLU's 102 to modulate the resistance of each of the MLU's 102. An amplified output signal 132 of the MLU-based amplifier 200 may flow through output line 116, and may be measured across output terminals 204 and 206. The MLU-based amplifier may include bias circuitry that supplies DC power, and that facilitates setting an operating point for the amplifier. The bias circuitry may include circuitry 208 that supplies a DC bias current 210 to facilitate generation of the output signal 132. However, the MLU amplification module 100 itself may not contain any silicon transistors, as none are needed to drive each MLU 102. The MLU amplification module 100 may be solely driven externally through its input and output terminals.

Appendix A is included as part of U.S. Provisional Application No. 61/608,015, and is incorporated by reference herein. Appendix A describes particular embodiments of the MLU-based amplifier 200, and any restrictive or limiting statements in Appendix A applies only to those particular embodiments. As described in Appendix A, an individual MLU 102 implemented as a single MTJ cell may, in one example, have a power gain of about −2 dB. At the same time, the feed forward coupling capacitance between input and output of each MLU 102 is very small. To increase the gain of the MLU-based amplifier 200 while maintaining a very small coupling capacitance, many MLU's 102 may be coupled together. In one embodiment, arrays of magnetic logic units (MLU's) 102 are used to design MLU-based amplifiers of large gains and extended cutoff frequencies.

The MLU 102 can be implemented with one magnetization, namely a storage magnetization 146, that is aligned in a particular stored direction. The MLU 102 can be implemented with another magnetization, namely a sense magnetization 144, that is aligned by a magnetic field generated by the input current corresponding to the input signal 130. This type of MLU 102 is known as self-referenced. Alternatively, the MLU 102 can be implemented with the sense magnetization 144 and a reference magnetization, which is typically a magnetization that may be pre-configured, such as in the factory, but subsequently may have a fixed direction.

Referring to FIGS. 1 and 3, the MLU 102 includes a sense layer 104, a storage layer 106, and a layer 908 (see FIG. 4) that is disposed between the sense layer 104 and the storage layer 106. Other implementations of the MLU 102 are contemplated. For example, the relative positioning of the sense layer 104 and the storage layer 106 can be reversed, with the storage layer 106 disposed above the sense layer 104.

Figure 4:
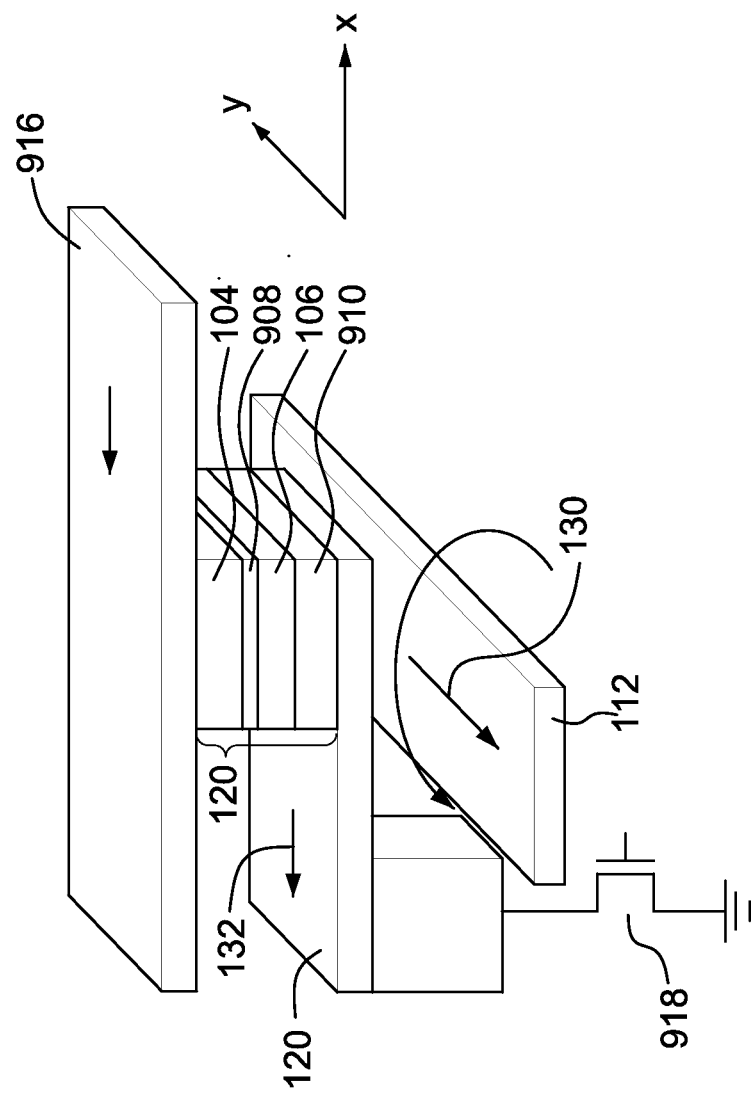
FIG. 4 illustrates a perspective view of the MLU and supporting circuitry that may be included in the MLU amplification module, according to an embodiment of the invention.

FIG. 4 illustrates a perspective view of the MLU 102 and supporting circuitry that may be included in the MLU amplification module 100, according to an embodiment of the invention. Referring to FIGS. 1 and 4, each of the sense layer 104 and the storage layer 106 includes, or is formed of, a magnetic material and, in particular, a magnetic material of the ferromagnetic type. A ferromagnetic material can be characterized by a substantially planar magnetization with a particular coercivity, which is indicative of a magnitude of a magnetic field to reverse the magnetization after it is driven to saturation in one direction. In general, the sense layer 104 and the storage layer 106 can include the same ferromagnetic material or different ferromagnetic materials. As illustrated in FIG. 1, the sense layer 104 can include a soft ferromagnetic material, namely one having a relatively low coercivity, while the storage layer 106 can include a hard ferromagnetic material, namely one having a relatively high coercivity. In such manner, a magnetization of the sense layer 104 can be readily varied under low-intensity magnetic fields generated in response to the input signal 130, while a magnetization of the storage layer 106 remains stable. Suitable ferromagnetic materials include transition metals, rare earth elements, and their alloys, either with or without main group elements. For example, suitable ferromagnetic materials include iron ("Fe"), cobalt ("Co"), nickel ("Ni"), and their alloys, such as permalloy (or $Ni_{80}Fe_{20}$); alloys based on Ni, Fe, and boron ("B"); $Co_{90}Fe_{10}$; and alloys based on Co, Fe, and B. In some instances, alloys based on Ni and Fe (and optionally B) can have a smaller coercivity than alloys based on Co and Fe (and optionally B). A thickness of each of the sense layer 104 and the storage layer 106 can be in the nm range, such as from about 1 nm to about 20 nm or from about 1 nm to about 10 nm. Other implementations of the sense layer 104 and the storage layer 106 are contemplated. For example, either, or both, of the sense layer 104 and the storage layer 106 can include multiple sub-layers in a fashion similar to that of the so-called synthetic antiferromagnetic layer.

In another embodiment, the MLU 102 may include the storage layer 106 and a reference layer instead of the sense layer 104, with the layer 908 disposed between the storage layer 106 and the reference layer. Each of the reference layer and the storage layer 106 includes, or is formed of, a magnetic material and, in particular, a magnetic material of the ferromagnetic type, the characteristics of which are described previously with reference to FIG. 1. In general, the reference layer and the storage layer 106 can include the same ferromagnetic material or different ferromagnetic materials. The reference layer is different from the sense layer 104 in that the reference layer typically has a high coercivity, such as a coercivity higher than the storage layer 106.

The layer 908 functions as a tunnel barrier, and includes, or is formed of, an insulating material. Suitable insulating materials include oxides, such as aluminum oxide (e.g., $Al_2O_3$) and magnesium oxide (e.g., MgO). A thickness of the layer 908 can be in the nm range, such as from about 1 nm to about 10 nm.

Referring to FIGS. 1 and 4, the MLU 102 also includes the pinning layer 910, which is disposed adjacent to the storage layer 106 and, through exchange bias, stabilizes the storage magnetization along a particular one of the pair of directions when a temperature within, or in the vicinity of, the pinning layer 910 is lower than a temperature $T_{BS}$. The temperature $T_{BS}$ can correspond to a blocking temperature, a Neel temperature, or another threshold temperature. The pinning layer 910 unpins, or decouples, the storage magnetization direction when the temperature is at, or above, the blocking temperature $T_{BS}$, thereby allowing the storage magnetization direction to be switched to another one of the pair of directions.

In one embodiment, such a pinning layer is omitted adjacent to the sense layer 104, and, as a result, the sense layer 104 has a sense magnetization direction that is unpinned and is readily varied, with the substantial absence of exchange bias.

In another embodiment, as previously described, the MLU 102 includes a reference layer instead of the storage layer 106. In this embodiment, an additional pinning layer may be disposed adjacent to the reference layer. This additional pinning layer may be characterized by a threshold temperature $T_{BR}$, with $T_{BR} > T_{BS}$. The temperature $T_{BR}$ can correspond to a blocking temperature, a Neel temperature, or another threshold temperature. Through exchange bias, this additional pinning layer stabilizes the reference magnetization along a substantially fixed direction at temperatures lower than the threshold temperature $T_{BR}$.

The pinning layer 910 (and the additional pinning layer disposed adjacent to the reference layer in the alternative embodiment) includes, or is formed of, a magnetic material and, in particular, a magnetic material of the antiferromagnetic type. Suitable antiferromagnetic materials include transition metals and their alloys. For example, suitable antiferromagnetic materials include alloys based on manganese ("Mn"), such as alloys based on iridium ("Ir") and Mn (e.g., IrMn); alloys based on Fe and Mn (e.g., FeMn); alloys based on platinum ("Pt") and Mn (e.g., PtMn); and alloys based on Ni and Mn (e.g., NiMn). In some instances, the blocking temperature $T_{BS}$ of alloys based on Ir and Mn (or based on Fe and Mn) can be in the range of about 120° C. to about 220° C. or about 150° C. to about 200° C., such as about 200° C., and can be smaller than the blocking temperature $T_{BS}$ of alloys based on Pt and Mn (or based on Ni and Mn), which can be in the range of about 300° C. to about 350° C.

Figure 5:
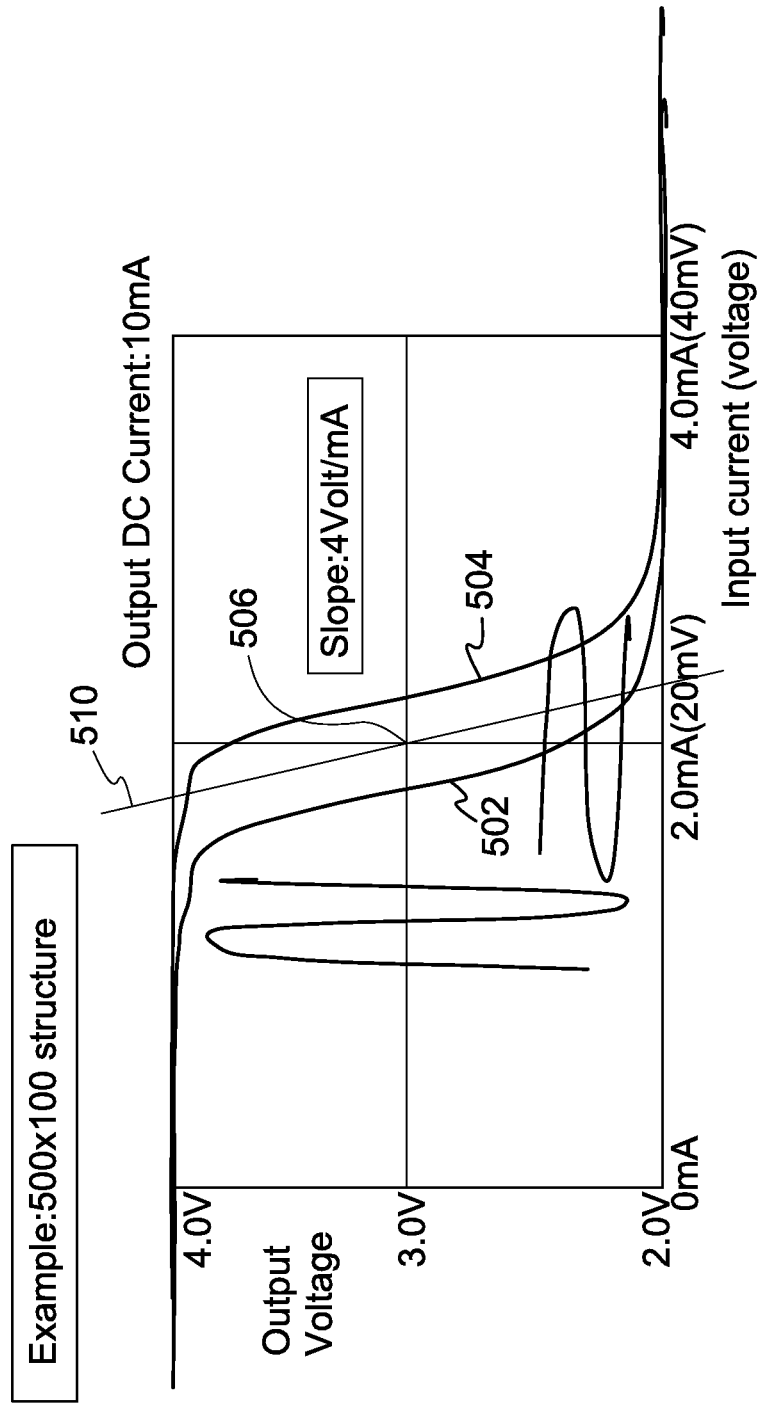
FIG. 5 illustrates an example of a response curve relating an output signal of the MLU-based amplifier to an input signal to the MLU-based amplifier, according to an embodiment of the invention.

Referring to FIGS. 1, 2, and 4, thermally assisted switching (TAS) technology, as applied to MLU's 102, provides one way of implementing a device with a resistance that varies in response to the input signal 130 for use in amplifiers, as explained herein. FIG. 5 illustrates an example of a response curve relating the output signal 132 of the MLU-based amplifier 200 to the input signal 130, according to an embodiment of the invention. In the example of FIG. 5, the MLU amplification module 100 includes an array of MLU's 102 with 500 parallel rows of MLU's 102, each row having 100 MLU's 102 in series (see, for example, FIG. 7 with Np equal to 500 and Ns equal to 100), and the output signal 132 of the MLU-based amplifier 200 is measured across the MLU amplification module 100. In one embodiment, the input signal 130 to the MLU amplification module 100 may flow through one or more field lines 112 such that a magnetic field generated by the input signal 130 is coupled to each of the MLU's 102. In one embodiment, the field line 112 may be positioned about 50 nm underneath the strap 120. When the input signal 130 is zero (e.g., zero input current), the sense magnetization 144 and the storage magnetization 146 of the MLU 102 are naturally substantially anti-aligned (e.g., substantially antiparallel), resulting in a series resistance of 2 KΩ per MLU 102 included in the MLU amplification module 100. When the input signal 130 is sufficiently small (e.g., less than a value in the range from about 1.5 mA to about 1.75 mA in the example shown in FIG. 5), the sense magnetization 144 and the storage magnetization 146 of the MLU 102 remain substantially anti-parallel, resulting in a series resistance of about 2 KΩ per MLU 102. When the input signal 130 is sufficiently large (greater than a value in the range from about 2.25 mA to about 2.5 mA in the example shown in FIG. 5), the sense magnetization 144 becomes substantially aligned (e.g., substantially parallel) with the storage magnetization 146, resulting in a series resistance of about 1 KΩ per MLU 102. It is contemplated that these resistance values, and in particular the ratio between these resistance values, may be varied for other embodiments of the MLU 102 based on forming the sense layer 104, the storage layer 106, and/or the layer 108 from different choices of materials, material concentrations, and/or material thicknesses.

In the example of FIG. 5, and also referring to FIG. 2, the input signal 130 includes 2 mA DC current along with the AC input signal. The variations in the input signal 130 due to the AC input signal result in variations in the resistances of each MLU 102 magnetically connected to the field line 112, and therefore in a variation of the combined resistance of the MLU's 102 included in the MLU amplification module 100. The DC bias current 210 flows through the MLU amplification module 100, generating an output voltage based on the variation of the combined resistance of the MLU's 102 included in the MLU amplification module 100. The output signal 132 may be this output voltage signal, or alternatively may be an output current signal generated based on this output voltage signal. The response curve relating the output signal 132 of the MLU-based amplifier 200 to the input signal 130 has a substantially linear region 510 around 2 mA input current that has a slope of about 4 Volts/mA. When an AC input signal is applied with a peak to peak amplitude of 0.5 mA, the AC output signal has a peak to peak output amplitude of 2.0 Volts.

The substantially linear region 510 may be formed as an average of the input-output response curves of multiple MLU's 102. In the example of FIG. 5, each MLU 102 switches over a different input current range. For example, MLU's 102 may switch over input currents in the range from about 1.5 mA to about 2.25 mA on the lower end 502, and in the range from about 1.75 mA to about 2.5 mA on the higher end 504 as shown in FIG. 5. To stay in the linear region of the IV response curve, the output voltage swing resulting from this input current swing may be about 80% of the full output voltage range. It is contemplated that these input current ranges may be varied across embodiments of the MLU 102 based on forming the sense layer 104, the storage layer 106, and/or the layer 108 from different choices of materials, material concentrations, and/or material thicknesses. For example, these input current ranges may typically vary from those shown in FIG. 5 to an input current range around a DC current of about 5 mA.

There are multiple ways to set up the MLU-based amplifier 200, such as linear, saturated, and class C. For linear amplification, such as for class A amplification, the input DC current can be adjusted to an operating point (bias point) where slope of the response curve is the highest (e.g., where a gain of the MLU-based amplifier 200 is substantially maximized). In the example of FIG. 5, this operating point is at about 2 mA input current. For maximum power efficiency, such as for class C amplification, the input DC current can be adjusted to an operating point where the DC power associated with the DC bias current 210 in the output stage of the MLU-based amplifier 200 is at its minimum, where the operating point remains within the substantially linear region 510. In the example of FIG. 5, this operating point is at about 2.25 mA input current. It is contemplated that averaging of the input-output response curves of many MLU's 102 (such as thousands of MLU's 102 in the example of FIG. 5) in an MLU-based amplifier 200 may result in increased linearity of the substantially linear region 510 of the MLU-based amplifier 200 as compared to the input-output response curve of a single MLU 102. It is also contemplated that averaging of the input-output response curves of many MLU's 102 in each MLU-based amplifier 200 may result in greater uniformity and predictability of the class A and class C operating points across the MLU-based amplifiers 200.

Referring to FIGS. 1 and 2, the output current per MLU 102 should be low enough to avoid heating the MLUs 102 close to the blocking temperature of the storage layer 106 (or in other embodiments, the reference layer). In the example of FIG. 5, the output current per MLU 102 is set at a conservative 20 μA to prevent the stored magnetizations from switching during amplification. A programming current (described further below) that sets the storage magnetization 146 (or in other embodiments, the reference magnetization) is anticipated to be approximately 0.2 mA per MLU 102, which is many times larger than the 20 μA setting during amplification. In the example of FIG. 5 (with Np=500 parallel rows of MLU's 102, each row having Ns=100 MLU's 102 in series), the total DC output current to maintain 20 μA per MLU 102 is (Np×20 μA), or 10 mA. When the DC bias current 210 is configured to be a constant 10 mA applied through the output, the voltage drop is about 2.0 Volts when all of the MLU's 102 are substantially aligned, and swings to about 4.0 Volts when all of the MLU's 102 are substantially anti-aligned.

Referring to FIGS. 2 and 5, the output power delivered to a load by the MLU-based amplifier 200 depends on the operating point, and impedance matching between the output of the MLU-based amplifier 200 and the load. We now determine a relationship between the output power of the MLU-based amplifier 200 and the output power of an individual MLU 102. The output power of the MLU-based amplifier 200 is:

$$Pout=\Delta(Vout) \times Iout/2 \quad (1)$$

In this example, the MLU-based amplifier 200 has Np parallel rows of MLU's 102, each row having Ns MLU's 102 in series. The voltage drop across the MLU-based amplifier 200 is then:

$$\Delta Vout = Ns \times Rmtj \times I_s \quad (2)$$

where Rmtj is the resistance of each MLU 102 with both domains substantially aligned. In this example Rmtj has a value of approximately 1 kOhm. $I_s$ is the current circulating in each row of Ns MLUs 102 in series. Then the total current circulating through the MLU-based amplifier 200 is:

$$Iout = I_s \times Np \quad (3)$$

The maximum output power delivered by the MLU-based amplifier 200 is:

$$Pout = Ns \times Np \times Rmtj \times I_s^2/2 \quad (4)$$

The right side of this equation can be rewritten in terms of Pmtj, the output power delivered by a single MLU 102:

$$Pout = N \times Pmtj \quad (5)$$

where N is the total number of MLU's 102 in the MLU-based amplifier 200. This analysis indicates that the architecture of the MLU-based amplifier 200 may be highly scalable, as the higher the number of interconnected MLU's 102, the higher the output power of the MLU-based amplifier 200 may be. This analysis also indicates that the output power of the MLU-based amplifier may not be dependent on whether the MLU's 102 are connected in series or in parallel. For example, an MLU-based amplifier 102 including 50,000 MLU's 102 has a Pout of 10 mW for various possible example configurations:

Configuration 1: Np=2,500, Ns=20: ΔVout=0.4V Iout=50 mA Pout=10 mW

Configuration 2: Np=1,000, Ns=50: ΔVout=1.0V Iout=20 mA Pout=10 mW

Configuration 3: Np=500, Ns=100: ΔVout=2.0V Iout=10 mA Pout=10 mW

For configuration 3, if the AC signal at the input stage has a peak current of 0.25 mA and a voltage of 2 mV, the value of Pin, the power in, is 0.5 μW. The Pout in the linear range may be at least 5 mW, so the resulting gain in power may be 5,000.

As can be seen from the above example, and referring to FIG. 2, the DC bias current 210 and the peak-to-peak voltage of the output signal 132 for a given maximum output power of the MLU-based amplifier 200 are dependent on the number of parallel rows of MLU's 102, and the number of MLU's 102 in series in each row. The DC bias current 210 and the peak-to-peak voltage of the output signal 132 for a given maximum output power of the MLU-based amplifier 200 are therefore dependent on the combined resistance of the MLU's 102 included in the MLU-based amplifier 200.

Referring to FIGS. 1 and 4, the storage layer 106 may be configured through a configuration operation. This configuration operation may occur during processing by the MLU-based amplifier 200. In one embodiment, during a programming cycle, a relatively small current is applied through the MLU 102 to heat the pinning layer 910 by Ohmic effect. When a temperature of the pinning layer 910 is above a threshold temperature, the direction of the storage magnetization 146 is unpinned, thereby allowing the storage magnetization 146 to be programmed by applying a current through the field line 112 that is magnetically connected to the cell. The storage magnetization 146 can be configured in a first direction by applying the current in one particular direction, and can be configured in a second direction opposite to the first direction by applying the current in an opposite direction. After programming, the MLU 102 is cooled below the threshold temperature, thereby pinning the storage magnetization 146 in the programmed direction. In another embodiment (in which the MLU 102 may include a reference layer instead of the storage layer 106), a magnetization of the reference layer may be pre-configured, such as in the factory. Alternatively, in one embodiment, the storage magnetization 146 may be pre-configured, such as in the factory, by at least one of a field line external to the MLU-based amplifier 200 and an external heating mechanism. In another embodiment, the storage magnetization 146 may be pre-configured, such as in the factory, by at least one of the field line 112 (internal to the MLU-based amplifier 200) and an internal heating mechanism, such as a bit line (described below).

Still referring to FIGS. 1 and 4, the MLU amplification module 100 may also include a set of traces (or strip conductors) to provide programming functions. Specifically, a bit line 916 is electrically connected to the MLU 102 on the side of the sense layer 104 (or, in an alternative embodiment, the reference layer) and is substantially orthogonal to the field line 112, which is disposed below and magnetically connected to the MLU 102 on the side of the storage layer 106. The bit line 916 may include at least part of the output line 116 of FIG. 1, or may correspond to the output line 116 of FIG. 1. The MLU amplification module 100 may further include a transistor 918, which is electrically connected, through the strap 120, to the MLU 102 on the side of the storage layer 106. The transistor 918 is switchable between a blocked mode (OFF) and a conducting mode (ON), thereby allowing the flow of a current through the MLU 102. Other implementations of the MLU amplification module 100 are contemplated. For example, the relative orientation of the bit line 916 and the field line 112 can be varied from that illustrated in FIG. 4. As another example, the relative positioning of the bit line 916 and the field line 112 can be reversed, with the field line 112 disposed above the bit line 916.

Referring to FIG. 4, during a TAS-type programming cycle, the MLU 102 is heated by applying a heating current through the MLU 102 via the bit line 916, with the transistor 918 in a conducting mode. The MLU 102 is heated to a temperature above the blocking or threshold temperature $T_{BS}$ of the pinning layer 910, such that a magnetization of the storage layer 106 is unpinned. (In the alternative embodiment, the MLU 102 is heated to a temperature above the blocking or threshold temperature $T_{BS}$ of the pinning layer 910 but below the blocking or threshold temperature $T_{BR}$ of the additional pinning layer, such that a magnetization of the storage layer 106 is unpinned but the magnetization of the reference layer remains fixed.) Simultaneously or after a short time delay, the field line 112 is activated to induce a write magnetic field to switch the storage magnetization from an initial direction to another direction. Specifically, a write current is applied through the field line 112 to induce the write magnetic field to switch the storage magnetization direction, according to the direction of the write current. Because the storage magnetization direction can be aligned according to the write magnetic field, the storage magnetization direction can be switched between multiple directions according to a programming encoding scheme. One possible encoding scheme is implemented with a pair of directions that are displaced by about 180°, such that a "0" is assigned to one of the pair of directions, and a "1" is assigned to another one of the pair of directions.

Once the storage magnetization is switched to a programmed direction, the transistor 918 is switched to a blocked mode to inhibit current flow through the MLU 102, thereby cooling the MLU 102. The write magnetic field can be maintained during cooling of the MLU 102, and can be deactivated once the MLU 102 has cooled below the blocking temperature $T_{BS}$ of the pinning layer 910. Because the storage magnetization direction is pinned by the exchange bias of the pinning layer 910, its orientation remains stable so as to retain the stored magnetization direction.

Other implementations of programming cycles are contemplated. For example, the MLU 102 can be implemented with an anisotropic shape having a relatively high aspect ratio, such as about 1.5 or more. In such an anisotropic-shaped implementation of the MLU 102, the storage magnetization direction can be switched and can remain stable, without requiring the pinning layer 910. As another example, a programming cycle can be carried out by applying a write current through the MLU 102 via the bit line 916, using the so-called spin transfer torque ("STT") effect. In such a STT-type programming cycle, the write current can become spin polarized by passing through a polarizing magnetic layer (not illustrated) or through the sense layer 104, and a magnetization of the storage layer 106 can be switched according to a spin-polarized orientation of the write current. Switching of the storage layer magnetization with the spin-polarized write current also can be combined with a TAS-type programming cycle, such as by heating the MLU 102 above the blocking temperature $T_{BS}$ and then applying the spin-polarized write current through the MLU 102.

Figure 6:
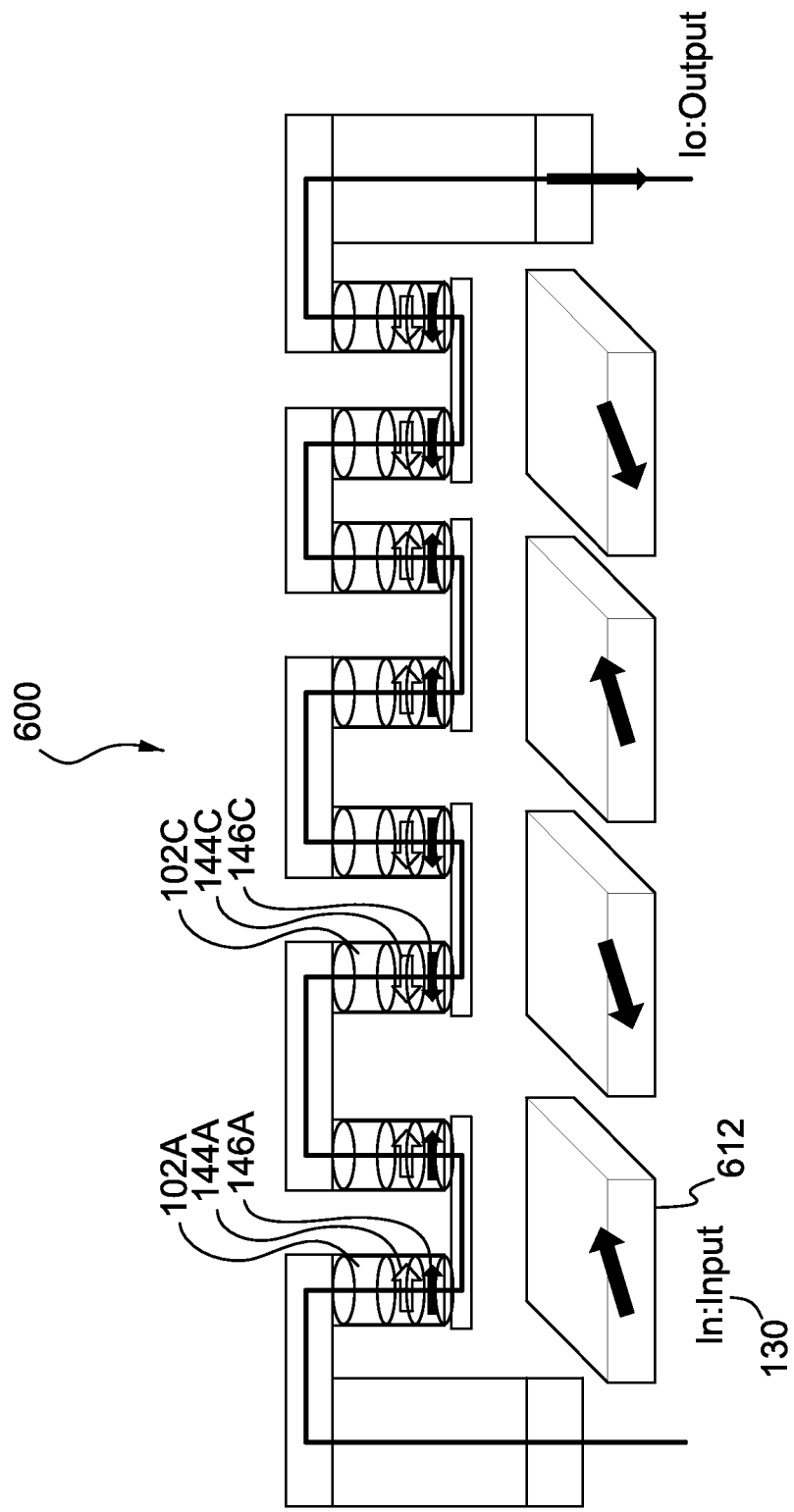
FIG. 6 illustrates a perspective view of an MLU amplification module, according to an embodiment of the invention.

FIG. 6 illustrates a perspective view of an MLU amplification module 600, according to an embodiment of the invention. The MLU amplification module 600 is in many respects similar to the MLU amplification module 100 already described with reference to FIG. 1. As described with reference to FIGS. 5 and 7, the MLU's 102 included in the MLU amplification module 600 may be arranged in an array with Np parallel rows of MLU's 102, each row having Ns MLU's 102 in series. This array may be compact. For example, 50,000 MLU's 102 may fit in a footprint with an area in the range from about 0.1 to about 0.5 square millimeters.

In one embodiment, the array of MLU's 102 included in the MLU amplification module 600 may be magnetically connected to a single field line 612. The field line 612 may be curved and/or serpentine (shown in FIG. 7). In this embodiment, the input current 130 flowing through the field line 612 flows in a first direction relative to the MLU 102A and in a second direction substantially opposite to the first direction relative to the MLU 102C. As a result, a direction (shown in FIG. 6) of the sense magnetization 144A and the storage magnetization 146A of the MLU 102A resulting from the input current 130 is substantially opposite to a direction (shown in FIG. 6) of the sense magnetization 144C and the storage magnetization 146C of the MLU 102C resulting from the input current 130.

For self-referenced MLU's 102, the configuration of the storage magnetization 146 of each of the MLU's 102 by the field line 612 allows the direction of the input current 130 flowing through the field line 612 to switch from a first direction to a second direction substantially opposite to the first direction. For example, prior to operating the MLU amplification module 600 with the input current 130 flowing in the first direction, the storage magnetizations 146 of the MLU's 102 may be configured with the input current 130 flowing in the first direction (described with reference to FIG. 4), and therefore based on the shape of the field line 612. Prior to operating the MLU amplification module 600 with the input current 130 switched to the second direction, the storage magnetizations 146 of the MLU's 102 may be configured with the input current 130 flowing in the second direction (described with reference to FIG. 4), and again based on the shape of the field line 612. In this way, in one embodiment, both directions of input current flow through a serpentine field line may be leveraged.

Alternatively, for MLU's 102 in which a reference magnetization is pre-configured (such as in the factory), the pre-configuration may be performed such that the direction of the reference magnetization corresponds to the first direction of input current flow through the field line 612, and is therefore based on the shape of the field line 612. In this embodiment, because the direction of the reference magnetization is not subsequently changed, the MLU amplification module operates with the input current 130 flowing in the first direction, but not with the input current 130 flowing in the second direction.

Figure 7:
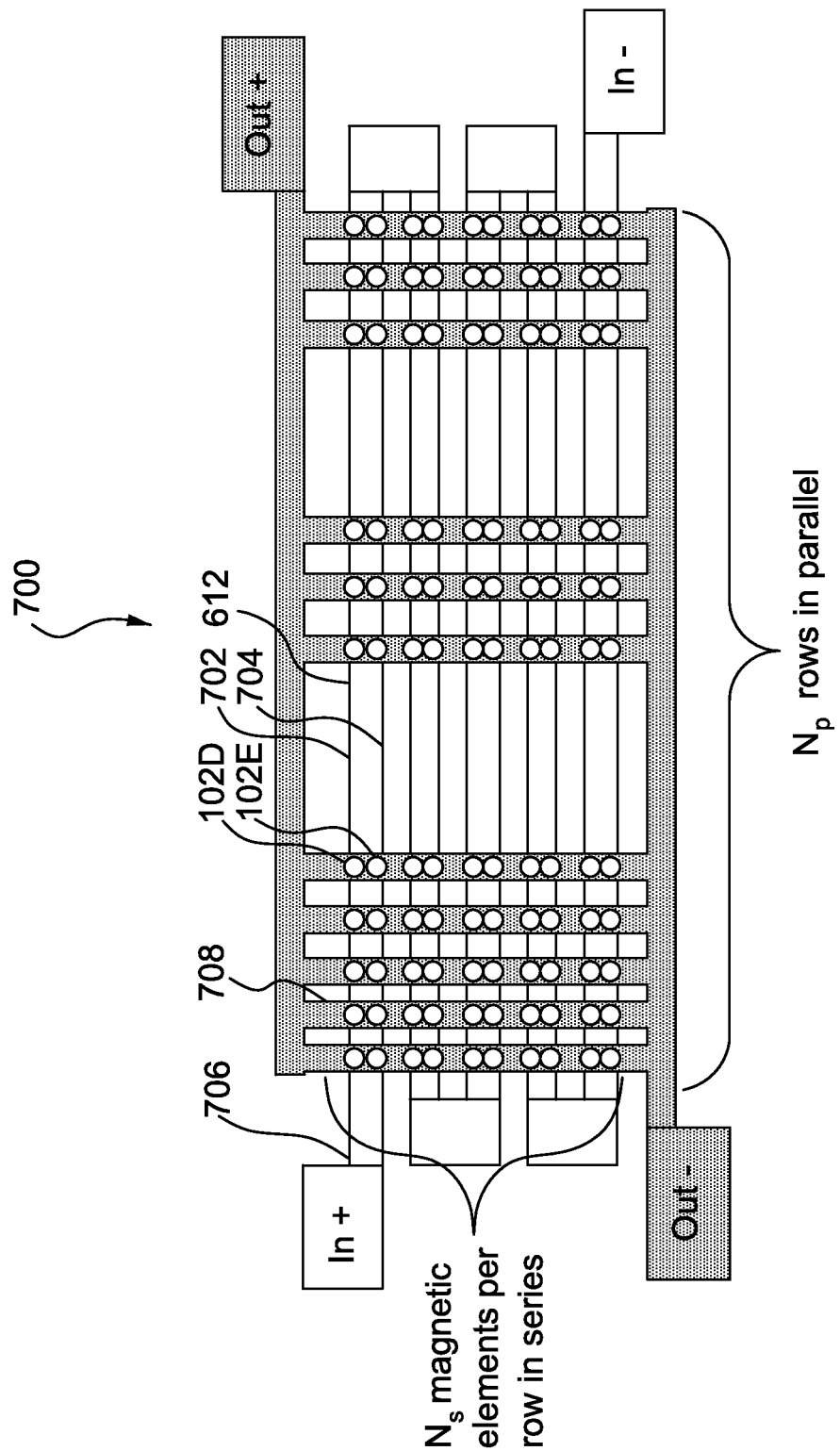
FIG. 7 illustrates a perspective view of an MLU amplification module, according to an embodiment of the invention.

FIG. 7 illustrates a perspective view of an MLU amplification module 700, according to an embodiment of the invention. The MLU amplification module 700 is in many respects similar to the MLU amplification module 600 already described with reference to FIG. 6, so differences are discussed here. In this embodiment, the field line 612 has a first lateral edge 702, a second lateral edge 704 opposite to the first lateral edge 702, and a first end 706. The MLU's 102 are divided into groups, where at least a portion of each of the MLU's 102 in each group is disposed between the first lateral edge 702 and the second lateral edge 704, and where each of the MLU's 102 in each group is disposed substantially the same distance (lengthwise along the field line 612) from the first end 706. In the embodiment of FIG. 7, there are two MLU's 102 in each group. For example, MLU's 102D and 102E are in one group. It is contemplated that in other embodiments, there may be more or fewer MLU's 102 in each group. For example, there may be one, three, four, or five MLU's in each group.

It may be advantageous to widen the field line 612 to accommodate the number of MLU's 102 in each group. As described in Appendix A, a wider field line 612 has a lower resistance, which can reduce the input power per MLU 102. In addition, a larger number of MLU's 102 per group can also reduce the input power per MLU 102. However, it should be noted that effectiveness of cladding adjacent to the field line 612 (for focusing the magnetic field generated by the field line 612 so that magnetic coupling to the MLU's 102 is increased) may be reduced for a wider field line 612.

Figure 8:
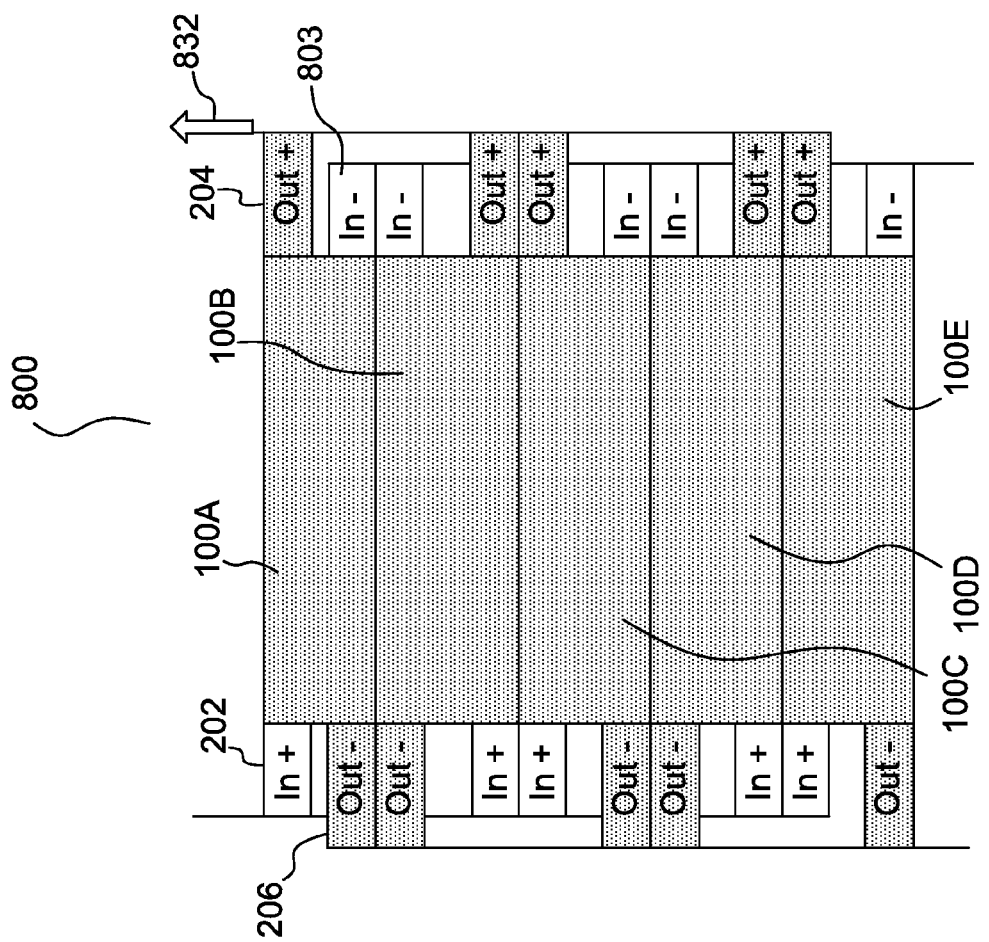
FIG. 8 illustrates a perspective view of multiple MLU amplification modules connected together in a larger array, according to an embodiment of the invention.

FIG. 8 illustrates a perspective view of multiple MLU amplification modules 100 connected together in a larger array 800, according to an embodiment of the invention. The MLU amplification modules 100 (100A-100E in this embodiment) may be disposed laterally adjacent to each other, with input ports 202 connected together, input ports 803 connected together, output ports 204 connected together, and output ports 206 connected together. In this way an output signal 832 with increased output power can be generated, as compared to the output signal 132 (see FIG. 2) of a single MLU amplification module 100. It is contemplated that other embodiments of MLU amplification modules, such as MLU amplification modules 600 and 700, may also be connected together in this manner to obtain an output signal with increased output power.

Figure 9:
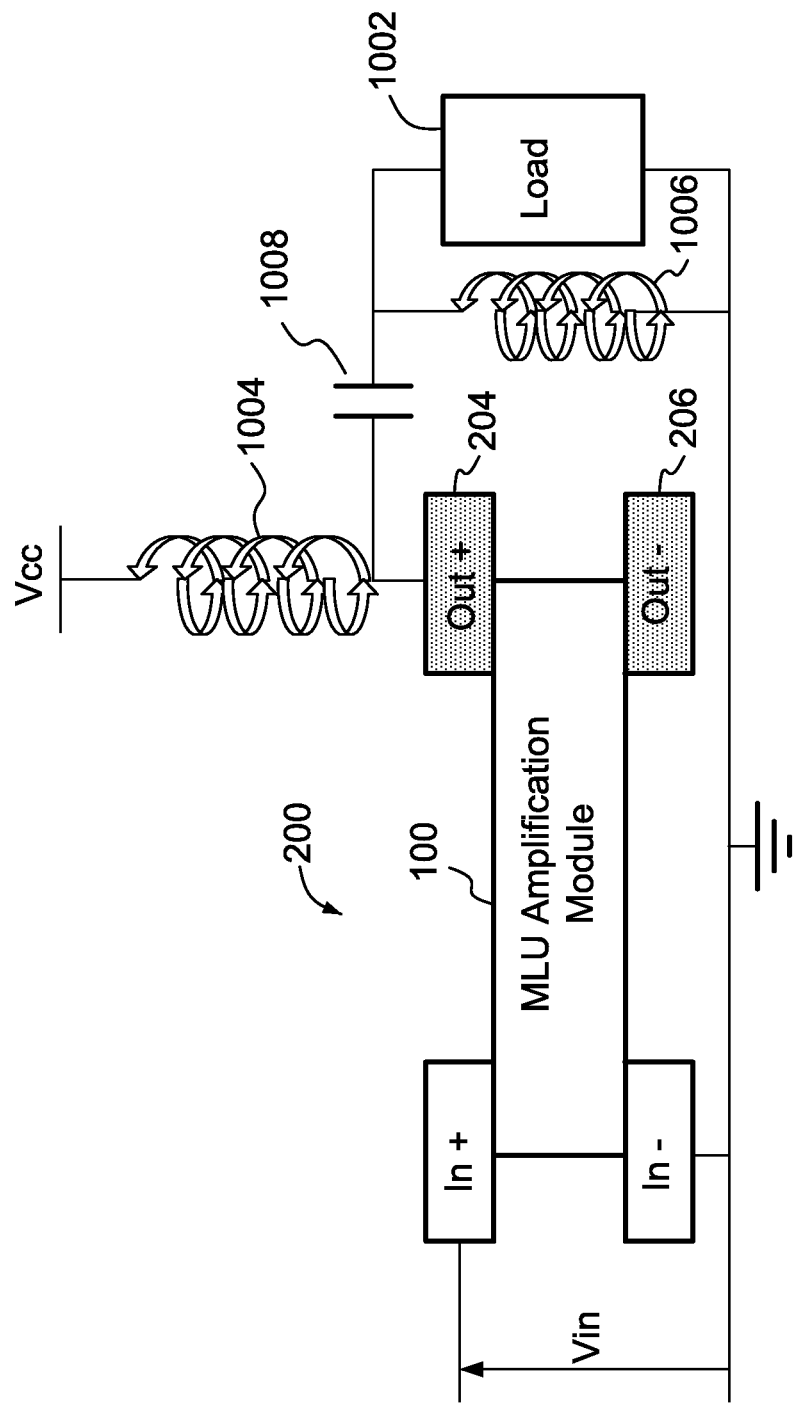
FIG. 9 illustrates a logical block diagram of an MLU-based amplifier that is impedance matched to an output load, according to an embodiment of the invention.

FIG. 9 illustrates a logical block diagram of an MLU-based amplifier 200 that is impedance matched to an output load 1002, according to an embodiment of the invention. The output resistance of the MLU amplification module 100 (across the output terminals 204 and 206) may be set to facilitate impedance matching to the load 1002. Referring to FIG. 7, for example, Ns (the number of MLU's 102 per output row 708 in series) and Np (the number of rows 708 of MLU's 102 in parallel) can be pre-configured (such as during fabrication) for a given total number (Ns×Np) of MLU's 102 to set the output resistance of the MLU amplification module 100. In addition, inductances 1004 and 1006 and capacitance 1008 can be determined and/or set for impedance matching to the load 1002. For example, these components can be pre-configured during fabrication.

In addition, the input resistance of the MLU amplification module 100 may be set to facilitate input impedance matching. For example, a width of the field line 112 (see FIG. 1) may be pre-configured (such as during fabrication) to set the input resistance of the MLU amplification module 100. One of ordinary skill in the art would understand how to determine the input resistance of the MLU amplification module 100 and any inductances and capacitances needed for input impedance matching. One of ordinary skill in the art would also understand how to pre-configure these components (such as during fabrication).

Figure 10:
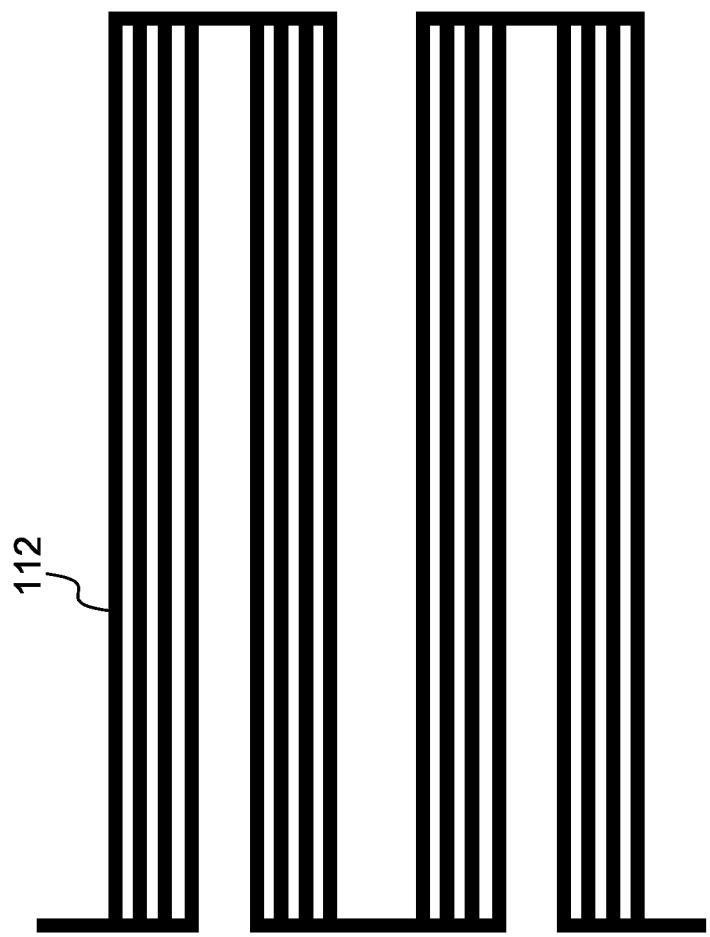
FIG. 10 illustrates multiple field lines in parallel, according to an embodiment of the invention.

FIG. 10 illustrates multiple field lines 112 in parallel, according to an embodiment of the invention. Each of the multiple field lines 112 has an impedance that may include a resistive component (corresponding to a resistance) and a reactive component (corresponding to an inductance and/or a capacitance). As described in Appendix A, it may be advantageous to provide multiple field lines 112 in parallel to reduce the input resistance of the MLU amplification module 100. Multiple field lines 112 in parallel have a lower resistance, which can reduce the input power dissipation per MLU 102. Multiple field lines 112 in parallel may also increase the effectiveness of cladding adjacent to the field line 612 (for focusing the magnetic field generated by the field line 612 so that magnetic coupling to the MLU's 102 is increased) as compared to the wider field line 612 described with reference to FIG. 7.

Figure 11:
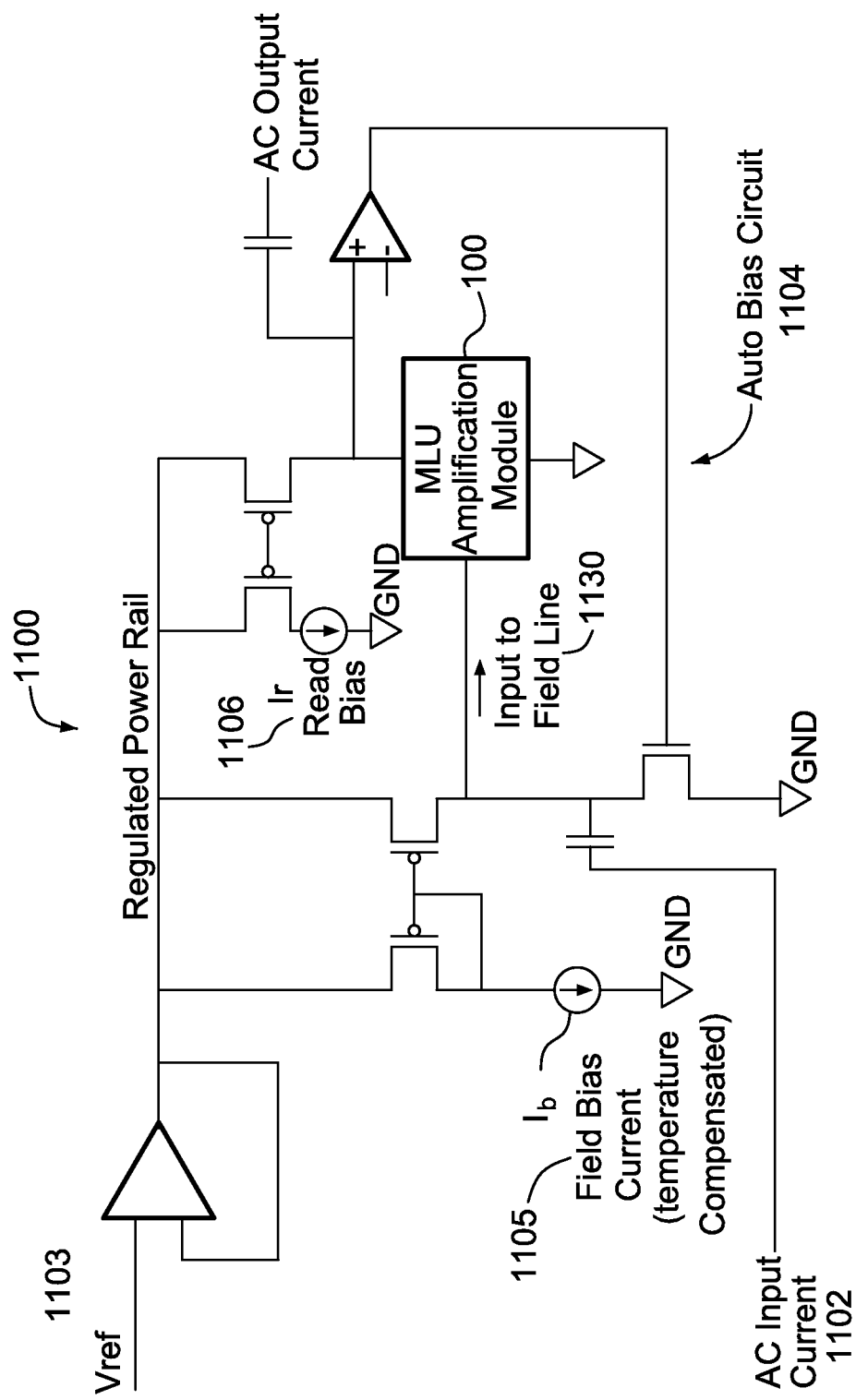
FIG. 11 illustrates an MLU-based amplifier including a feedback circuit configured to control linearity of amplification of an input AC signal, according to an embodiment of the invention.

FIG. 11 illustrates an MLU-based amplifier 1100 including a feedback circuit 1104 configured to control linearity of amplification of an input AC signal 1102, according to an embodiment of the invention. An input signal 1130 to the MLU amplification module 100 is generated based on field bias current 1105 and AC input current 1102. The operating point (see description with reference to FIG. 5) is based on the field bias current 1105, which is temperature compensated in a manner that is understood by one of ordinary skill in the art. A reference voltage 1103 and a read bias current 1106 are provided to the MLU amplification module 100 to set the output voltage and current of the MLU amplification module 100 based on Ns (the number of MLU's 102 per row in series) and Np (the number of rows of MLU's 102 in parallel). Feedback from the output of the MLU amplification module is provided by the feedback circuit 1104 such that the input signal 1130 is varied to control linearity of amplification of an input AC signal 1102, such as by setting the combined resistance of the MLU's 102.

In one embodiment, and with reference to FIGS. 1 and 2, the switching of the storage magnetization 146 and the sense magnetization 144 may be faster than electron transfer mechanisms, which can result in an extended cutoff frequency for the MLU amplifier 200. The switching may occur in the range from about 5 picoseconds to about 20 picoseconds, such as about 10 picoseconds. With such a value, the MLU amplifier 200 may be capable of operating in the 100 GHz range. Unlike traditional semiconductor devices, the Miller effect (or increase in parasitic capacitance resulting from a gain amplified feedback loop of the output to the input) is reduced. Between the field line 112 and the strap 120 under the MLU 102, there is a parasitic capacitance that shunts the device at extremely high frequency. In embodiments of the invention, this capacitance may be reduced by:

Reducing the size of the MLU's 102 and the strap 120 connecting two adjacent MLU's 102;

Using low dielectric constant (K) material for the dielectric located between the MLU's 102 and the field line 112; and Using separated field lines 112 to reduce overlap area between the strap 120 and the field lines 112.

In one example, the parasitic capacitance per MLU 102 is $$C = k e_0 A / d \quad (6)$$

with K=3.9; vacuum permittivity $e_0$=8.86×10$^{-14}$ F/cm; area A=200 nm×100 nm; and distance d=50 nm. The total capacitance of multiple MLU's 102 is C multiplied by the total number of MLU's 102, and the cutoff frequency is 1/RC. This yields a maximum cutoff frequency of 400 GHz for a 10 mW 2,500×20 (Np=2,500, Ns=20) device operating with a swing voltage of 0.4 Volts; or 25 GHz for a 1,000×50 (Np=1,000, Ns=50) operating at 1 Volt. Separating the field line 112 into two field lines 112 in parallel and using a dielectric with K=2.5 may enhance the maximum cutoff frequency to about 1 THz. Other parasitic capacitances do exist so the actual cutoff frequency may be somewhat lower. However, these cutoff frequency values are larger than those of existing technologies.

In one example, and referring to FIGS. 1 and 2, the power added efficiency of the MLU amplification module 100 is Peff=(AC Pout)/DC Power. The DC power to operate the MLU device in a class C mode may be the multiplication of the bias voltage Vcc (see FIG. 9) by the DC current circulating through the output of the MLU amplification module 100 when all magnetic domains of the MLU's 102 are aligned (minimum resistivity). In one example, the maximum resistance of each MLU 102 (at a first phase of the AC signal) is approximately double the minimum resistance of each MLU 102 (at a second, opposite phase of the AC signal). This suggests that the power added efficiency may be about 50%. It may be advantageous to increase the power added efficiency above this value, such as by increasing the ratio between the resistance of the MLU 102 when the storage magnetization 146 and the sense magnetization 144 are aligned (e.g., substantially parallel) and the resistance of the MLU 102 when the storage magnetization 146 and the sense magnetization 144 are anti-aligned (e.g., substantially anti-parallel). It is contemplated that these resistance values, and in particular the ratio between these resistance values, may be varied for other embodiments of the MLU 102 based on forming the sense layer 104, the storage layer 106, and/or the layer 108 from different choices of materials, material concentrations, and/or material thicknesses. For example, a ratio of 75%-90% could significantly increase the power added efficiency.

The performance of the MLU's 102 can be characterized in terms of tunnel magnetoresistance (TMR). TMR can be expressed as:

$$TMR = ((R\text{anti-parallel}) - (R\text{parallel})) / (R\text{parallel}) \quad (7)$$

For an Rparallel of 1 kOhm and an Ranti-parallel of 2 kOhm, the TMR is 100%, which may yield a power added efficiency that is below 50% class C. A TMR of 200% may yield a higher power added efficiency of 66%, and a TMR of 1000% may yield 90%. These higher TMR values may allow the MLU-based amplifier 200 to operate with a lower static DC bias current, minimizing power losses. Increasing TMR may also increase linearity.

Referring to FIG. 7, to efficiently extract heat to maintain the temperature of the MLU's 102 below the blocking temperature (such as below 150° C.) during amplification, the MLU's 102 may be spread out across a larger area, such as by increasing the separation of the MLU's 102 in each row and by increasing the spacing between the rows. On the other hand, to heat the MLU's 102 above the blocking temperature during configuration of the storage magnetizations 146, one or more of the following approaches may be used:

Increase the voltage 10 times above the normal operating voltage of the MLU's 102 during the heating cycle;

Increase the duration of the heating cycle;

Increase the external temperature of the die during factory programming by placing it in an heating device like an hot chuck, hot gas blower, lamp, etc.;

Place extra pins in the device that allow localized heating of pieces of the array of MLU's 102; and Use large external magnetic fields.

Referring to FIGS. 6, 7, and 10, the input field line 612 has a linear resistance Rin, a parasitic capacitance Cin, and a parasitic inductance Lin. Reduction of these losses can be achieved by one or more of the following:

Reduce the resistivity of the copper line forming the field line 612;

Increase the spacing between segments of the field line 612, if curving or serpentine, and/or between multiple field lines 612;

Use low k material as a dielectric between the segments of the field line 612 and/or between multiple field lines 612; and Insert a dummy absorbing layer between the segments of the field line 612 and/or between multiple field lines 612.

With regard to manufacturing and layout considerations, and referring to FIGS. 1, 2, and 4, the MLU-based amplifier 200 can be manufactured directly on substrates without CMOS with a total of 5-6 masking layers. In one embodiment, the process flow may include the following steps:

1> Planar dielectric deposition
   Selective dry etch of the dielectric to form metal 1 interconnect (Mask 1)
   Blanket cladding layer deposition
   Blanket Cu deposition
   CMP to finalize metal 1 (such as field line 112 and metal portions electrically connected to output line 116)
2> Planar dielectric deposition
   Strap metal deposition (such as strap 120)
   Selective etch of the strap (Mask 2)
3> Magnetic stack deposition (such as at least magnetic layers included in MLU's 102) (may include finishing by Tantalum)
   Selective etch of the magnetic stack (Mask 3)
   Dielectric filling
   CMP to expose the magnetic stack and/or Tantalum finishing layer
4> Selective etch of vias connecting portions of metal 1 and metal 2 (mask 4)
5> Planar deposition of metal 2 (such as output line 116)
   Selective etch of metal 2 (Mask 5)
6> Planar deposition of passivation (optional)
   Selective etch of passivation (optional mask 6)

Referring to FIGS. 1 and 7, in one embodiment, the array of MLU's 102 includes a combination of two perpendicular comb-shaped metal layers. The first metal layer includes the input field line 112, and the second metal layer includes the output rows 708.

Referring to FIGS. 1 and 2, in one embodiment the MLU-based amplifier 200 may be a low-loss switch. For example, the stored magnetizations 146 may be configured in the opposite direction from input current flow in the field line 112 during switching operation to get substantially zero AC output, or may be configured in the same direction as input current flow in the field line 112 to get substantially full AC output. The programming cycle can be performed by applying a current high enough to heat MLU's 102 included in the MLU-based amplifier 200 above the blocking temperature, and a current to configure the storage magnetizations 146 in one direction or the opposite relative to the input current flowing through the field line 112 to get a pass or a no-pass. Such a programming cycle can be below 1 ms. In one embodiment, the programming cycle can be performed prior to passing the input signal 130 through the field line 112. Alternatively or in addition, the programming cycle can be performed concurrently with passing the input signal 130 through the field line 112. In this way, the combined resistance of the of the MLU's 102 included in the MLU amplification module 100 can be configured to provide an output signal with two levels. For example, referring to FIG. 5, when the DC bias current 210 is configured to be a constant 10 mA applied through the output, the voltage drop is about 2.0 Volts (substantially full AC output) when all of the MLU's 102 are substantially aligned, and swings to about 4.0 Volts (substantially zero AC output) when all of the MLU's 102 are substantially anti-aligned.

Referring to FIGS. 1, 2, and 5, and in one embodiment, the MLU's 102 may experience hysteresis. In particular, the magnitude of the input current 130 that aligns the storage magnetization 146 and the sense magnetization 144 to be substantially parallel as the input current 130 is increasing may be greater than the magnitude of the input current 130 that flips the storage magnetization 146 and the sense magnetization 144 back to be substantially anti-parallel as the input current 130 is decreasing. For example, if the mid-point input current 130 is 2 mA, it may take 2.1 mA to align the magnetizations to be substantially parallel as the input current 130 increases, and 1.9 mA to flip the magnetizations to be substantially anti-parallel as the input current decreases. For this degree of hysteresis, the MLU-based amplifier 200 may operate with a peak current of 0.2 mA.

Figure 12:
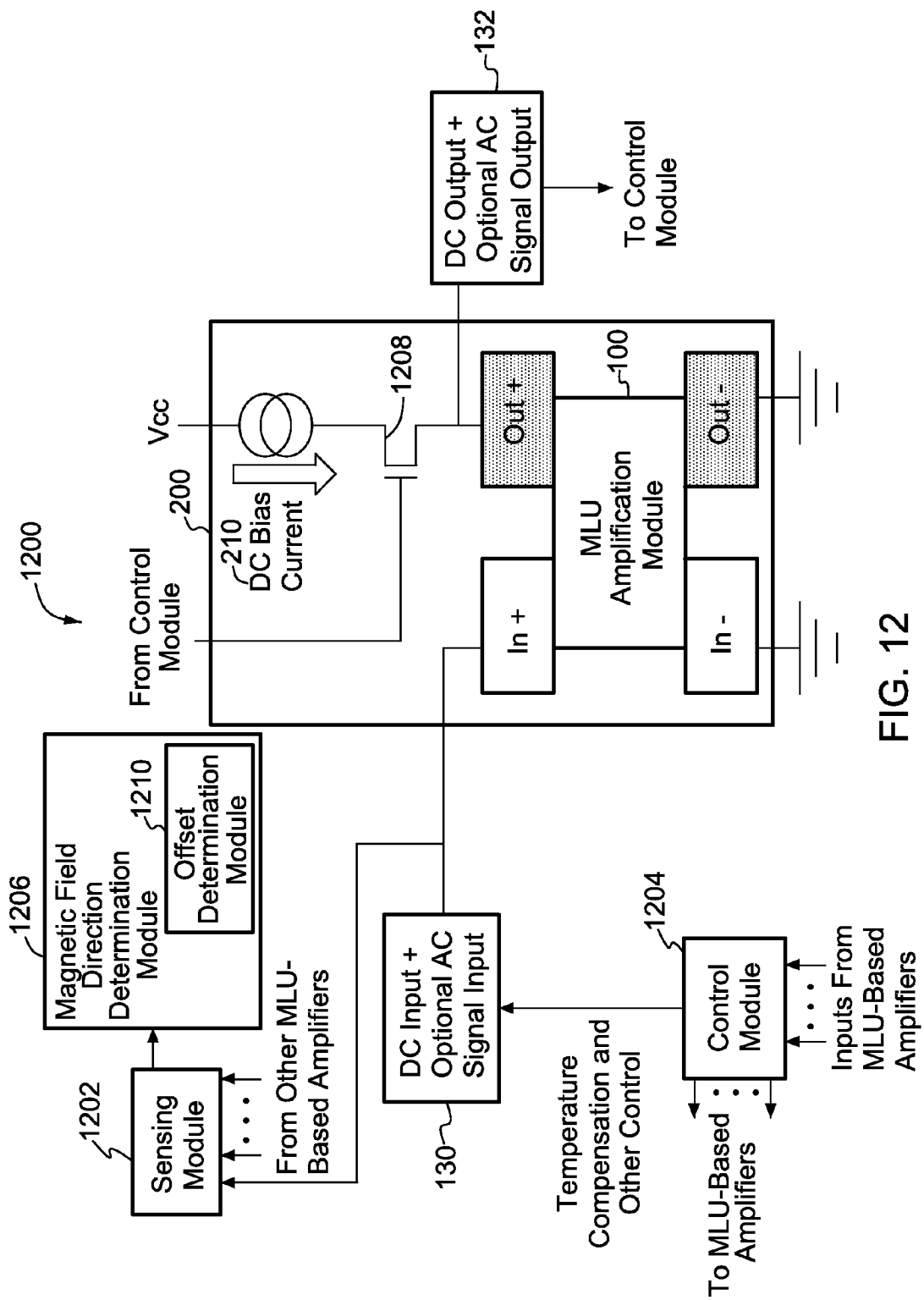
FIG. 12 illustrates a logical block diagram of an MLU-based magnetic field direction measurement device showing one of multiple MLU-based amplifiers included in an MLU-based device, according to an embodiment of the invention.
Figure 13:
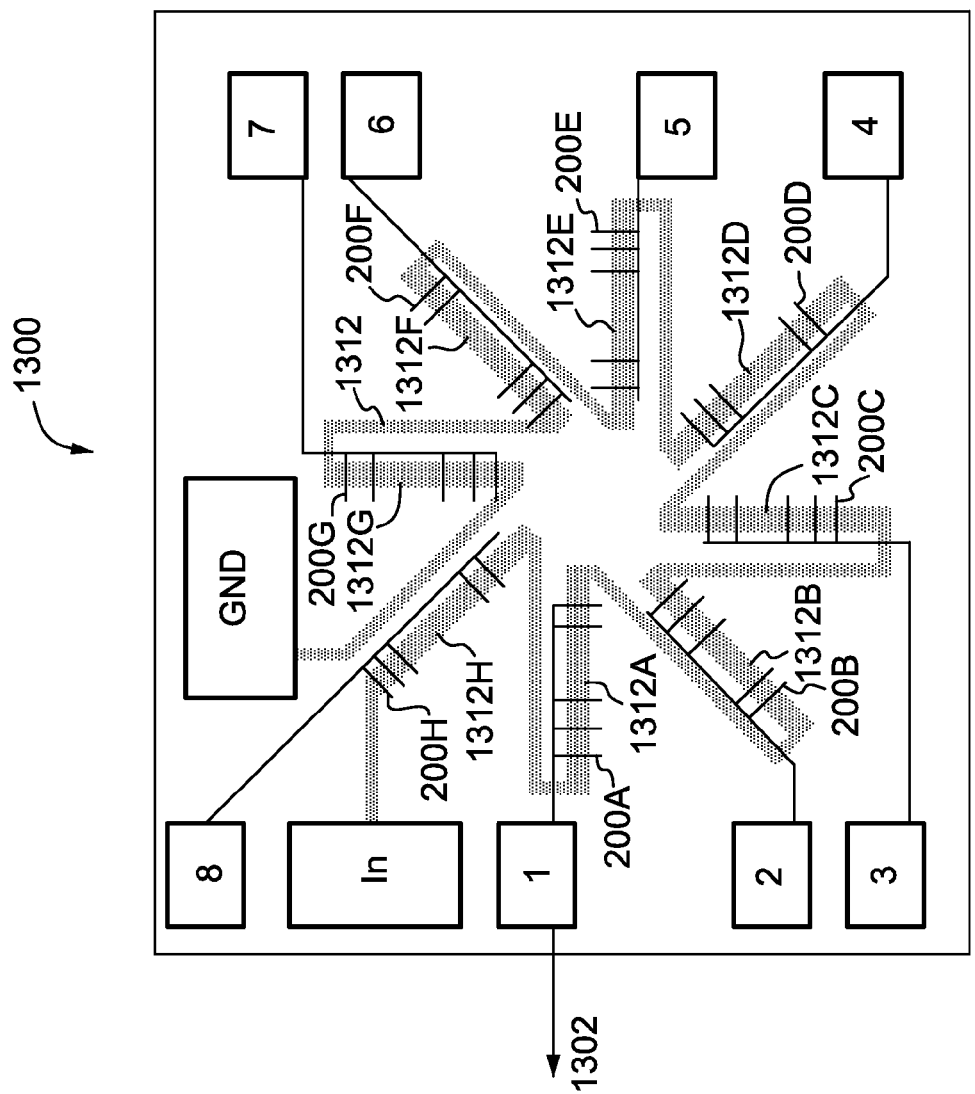
FIG. 13 illustrates an MLU-based magnetic field direction measurement device including a configuration of MLU-based amplifiers, according to an embodiment of the invention.
Figure 14:
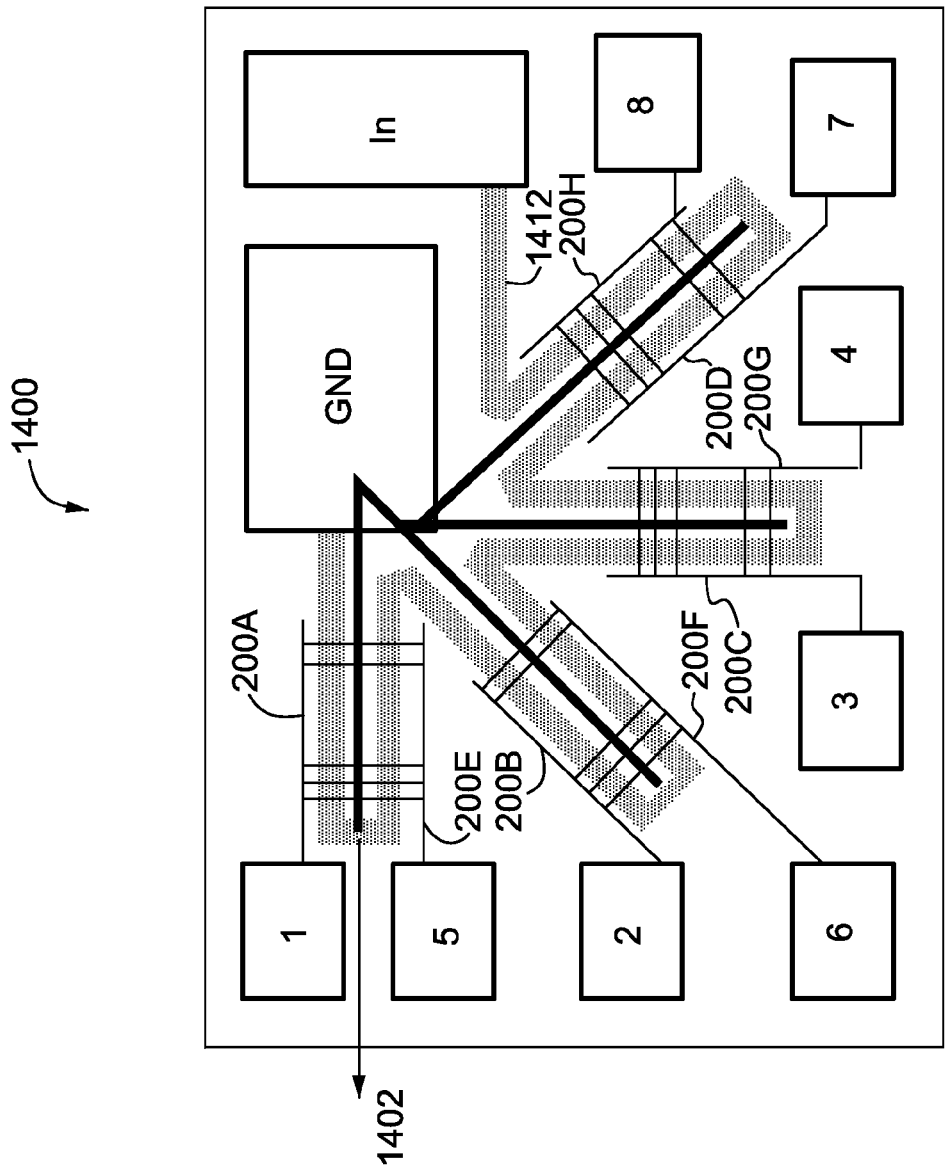
FIG. 14 illustrates an MLU-based magnetic field direction measurement device including a configuration of MLU-based amplifiers, according to an embodiment of the invention.

FIG. 12 illustrates a logical block diagram of an MLU-based magnetic field direction measurement device 1200 showing one of multiple MLU-based amplifiers 200 (see FIG. 2) included in the MLU-based device 1200, according to an embodiment of the invention. FIG. 13 illustrates an MLU-based magnetic field direction measurement device 1300 including a configuration of MLU-based amplifiers 200, according to an embodiment of the invention. FIG. 14 illustrates an MLU-based magnetic field direction measurement device 1400 including a configuration of MLU-based amplifiers 200, according to an embodiment of the invention. The MLU-based device 1200 includes multiple MLU-based amplifiers 200. The MLU-based amplifier 200 may include the MLU amplification module 100 (see FIG. 1), the MLU amplification module 600 (see FIG. 6), the MLU amplification module 700 (see FIG. 7), or other embodiments of MLU amplification modules previously described. The MLU-based devices 1300 and 1400 each have the logical structure of the MLU-based device 1200. The MLU-based amplifier 200 may include an array of Np rows of MLU's 102 in parallel, with Ns MLU's 102 in series per row (see FIG. 7).

The MLU-based magnetic field direction measurement device 1200 may be included in, for example, a magnetometer and/or a compass. In one embodiment, the MLU-based device 1200 measures a direction of an external magnetic field (such as the Earth's magnetic field) in two dimensions, e.g. a component of the external magnetic field in a two-dimensional plane. It is contemplated that devices incorporating design principles of the MLU-based device 1200 may also measure a direction of the external magnetic field in three dimensions, such as by using the MLU-based device 1200 with Hall effect vertical axis sensing. The Hall effect can result in a voltage difference (the Hall voltage) across an electrical conductor, transverse to an electric current in the conductor and a magnetic field perpendicular to the current. Based on the Hall effect, a component of the external magnetic field in the third dimension may be determined.

Referring to FIGS. 1, 13, and 14, an average storage magnetization of each of the MLU-based amplifiers 200 corresponds to a magnetization direction of an average of storage magnetizations 146 (magnetizations of the storage layers 106) of the MLU's 102 included in the each of the MLU-based amplifiers 200. It is contemplated that the MLU-based magnetic field direction measurement device 1200 is configured such that the MLU's 102 have substantially the same storage magnetizations resulting from magnetic fields generated by current flowing through one or more field lines (such as field lines 1312 or 1412), within the limits of manufacturing tolerances (such as of the MLU's 102) and non-uniformity in the magnetic fields generated by the field lines in the regions in which the MLU's 102 are located.

In one embodiment, the MLU-based magnetic field direction measurement device 1200 may include multiple MLU-based amplifiers 200 connected through a single field line 1312 (see FIG. 13), or a single field line 1412 (see FIG. 14). Alternatively, the MLU-based amplifiers 200 may be connected through multiple field lines, such as multiple field lines in parallel. The average storage magnetization direction of each of the MLU-based amplifiers 200 is unique so that the average storage magnetization direction of each of the MLU-based amplifiers 200 is oriented differently relative to an external magnetic field, such as the Earth's magnetic field.

In the embodiment of FIG. 13, the average storage magnetization directions of the MLU-based amplifiers 200 are substantially equally spaced by an angle of about 360 degrees divided by 8 (the number of MLU-based amplifiers 200), or about 45 degrees. The MLU-based amplifiers 200A-200H are located at angles of about 0°, about 45°, about 90°, about 135°, about 180°, about 225°, about 270°, and about 315°, respectively, relative to axis 1302 extending from the MLU-based amplifier 200A. The field line 1312 may include a plurality of portions 1312A-1312H, each disposed adjacent to a corresponding one of the MLU-based amplifiers 200A-200H, respectively. The field line 1312 may be configured such that a direction of current flow (for example, from In to GND) through each of the plurality of portions 1312A-1312H may have an angular orientation corresponding to an angular orientation of its corresponding MLU-based amplifier 200A-200H. In this way, current can be applied through the field line 1312 to configure the average storage magnetization direction of each of the MLU-based amplifiers 200 such that the average storage magnetizations of the MLU-based amplifiers 200B-200H rotate by about 45°, about 90°, about 135°, about 180°, about 225°, about 270°, and about 315°, respectively, relative to the average storage magnetization of the MLU-based amplifier 200A. In the embodiment of FIG. 13, the average storage magnetization direction of a first MLU-based amplifier 200 is opposite to the average storage magnetization direction of a second MLU-based amplifier 200 disposed substantially opposite the first MLU-based amplifier 200.

In the embodiment of FIG. 14, the MLU-based amplifiers 200 are spaced such that MLU-based amplifiers 200 having opposite average storage magnetization directions are disposed adjacent to (neighboring) each other, rather than substantially opposite to each other. For example, the MLU-based amplifiers 200A and 200E are disposed adjacent to each other in FIG. 14, but are disposed opposite to each other in FIG. 13. In this way, the MLU-based device 1400 occupies about half the area that is occupied by the MLU-based device 1300. At the same time, the average storage magnetization directions of the MLU-based amplifiers 200 included in the MLU-based device 1400 are still substantially equally spaced by an angle of about 360 degrees divided by 8 (the number of MLU-based amplifiers 200), or about 45 degrees. Specifically, in the embodiment of FIG. 14, the MLU-based amplifiers 200A-200H are located at angles of about 0°, about 45°, about 90°, about 135°, about 0°, about 45°, about 90°, and about 135°, respectively, relative to axis 1402 extending from the MLU-based amplifier 200A. However, because current flows through the field line 1412 in opposite directions for adjacent pairs of MLU-based amplifiers 200 (such as MLU-based amplifiers 200A and 200E), the average storage magnetizations of the MLU-based amplifiers 200B-200H rotate by about 45°, about 90°, about 135°, about 180°, about 225°, about 270°, and about 315°, respectively, relative to the average storage magnetization of the MLU-based amplifier 200A. This is similar to the MLU-based device 1300 of FIG. 13. Therefore, the MLU-based device 1400 can detect external magnetic fields in a similar manner to the MLU-based device 1300 while taking up less area.

It is contemplated that more or fewer MLU-based amplifiers 200 than 8 may be included in the MLU-based devices 1300 and 1400. For example, if N MLU-based amplifiers 200 are included in the MLU-based devices 1300 and 1400, then the average storage magnetization directions of the N MLU-based amplifiers 200 can be substantially equally spaced by an angle of 360 degrees divided by N. It is also contemplated that in other embodiments, the MLU-based amplifiers 200 may be arranged in other ways. For example, the storage magnetization directions of the MLU-based amplifiers 200 may not be substantially equally spaced. Also, the MLU-based amplifiers 200 may be spaced such that MLU-based amplifiers 200 having opposite average storage magnetization directions are neither disposed adjacent to (neighboring) each other, nor substantially opposite to each other.

Referring to FIGS. 5 and 12, the output 132, such as a current output and/or voltage output, of each of the MLU-based amplifiers 200 is based on a direction and magnitude of the external magnetic field (e.g., the Earth's magnetic field). The input 130 to each MLU-based amplifier 200 can be configured such that the operating point of the MLU-based amplifier 200 remains substantially at a midpoint 506 of the substantially linear region 510 of the I-V response curve shown in FIG. 5, if the MLU-based amplifier 200 is not in the presence of an external magnetic field. At this operating point, the average output impedance (primarily resistance) of the MLU's 102 included in the MLU-based amplifier 200 can be about (Rmax−Rmin)/2, where Rmax is the maximum output impedance (all storage magnetizations and sense magnetizations of the MLU's 102 included in the MLU-based amplifier 200 being substantially anti-aligned), and where Rmin is the minimum output impedance (all storage magnetizations and sense magnetizations of the MLU's 102 included in the MLU-based amplifier 200 being substantially aligned). At this operating point, about half of the MLU's 102 included in the MLU-based amplifier 200 may be substantially aligned (with an impedance of about Rmin), and the remaining MLU's 102 included in the MLU-based amplifier 200 may be substantially anti-aligned (with an impedance of about Rmax), resulting in the average output impedance of the MLU-based amplifier 200 of about (Rmax−Rmin)/2. It is contemplated that each MLU-based amplifier 200 includes many (e.g., thousands) of MLU's 102 to increase the uniformity of average output impedance values across MLU-based amplifiers 200 at the operating point.

When under the influence of the external magnetic field, each MLU 102 included in each of the MLU-based amplifiers 200 reacts, in that the magnetization of the sense layer 104 (see FIG. 1) of each of the MLU's 102 can rotate to an extent dependent on the direction and magnitude of the external magnetic field. There is an antiparallel component of the magnetization of the sense layer 104 due to coupling with the magnetization of the storage layer 106 (see FIG. 1). As a result, when the Earth's magnetic field at a particular location is substantially aligned with the average storage magnetization of a particular MLU-based amplifier 200 (and opposite to the antiparallel coupling component of the magnetization of the sense layers 104), the extent of the rotation of the sense layers 104 can be at its peak at that location, depending on the input 130. In one example, assuming that the component of the Earth's magnetic field in the storage magnetization direction 146 (see FIG. 1) is g % of the coupling component of the magnetization of the sense layers 104 of the MLU's 102 included in the MLU-based amplifier 200, the output impedance of the MLU-based amplifier 200 can change (relative to Rmin) by about (g×(Rmax−Rmin)/Rmin) percent. When the Earth's magnetic field at a particular location is substantially perpendicular to the average storage magnetization of the MLU-based amplifier 200, the MLU-based amplifier 200 can be substantially insensitive to the Earth's magnetic field. When the Earth's magnetic field at a particular location is substantially opposed to the average storage magnetization of the MLU-based amplifier 200, the output impedance of the MLU-based amplifier 200 can change (relative to Rmin) by about (g×(Rmin−Rmax)/Rmin) percent.

As described previously, and referring to FIGS. 1 and 12, the MLU's 102 included in the MLU-based amplifier 200 can be self-referenced and implemented based on TAS technology. Alternatively, the MLU 102 can be implemented with the sense magnetization 144 and a reference magnetization, which is typically a magnetization that may be pre-configured, such as in the factory, but subsequently may have a fixed direction. The storage layers 104 of the MLU's 102 are set by heating the MLU-based amplifier 200, followed by applying a current through the field line 112 to align the magnetizations of the storage layers 104 of each MLU-based amplifier 200 in the appropriate directions (for example, as described with reference to FIGS. 13 and 14). This setting may occur as pre-configuration in the factory and/or as configuration after the MLU-based amplifier 200 leaves the factory.

Figure 15:
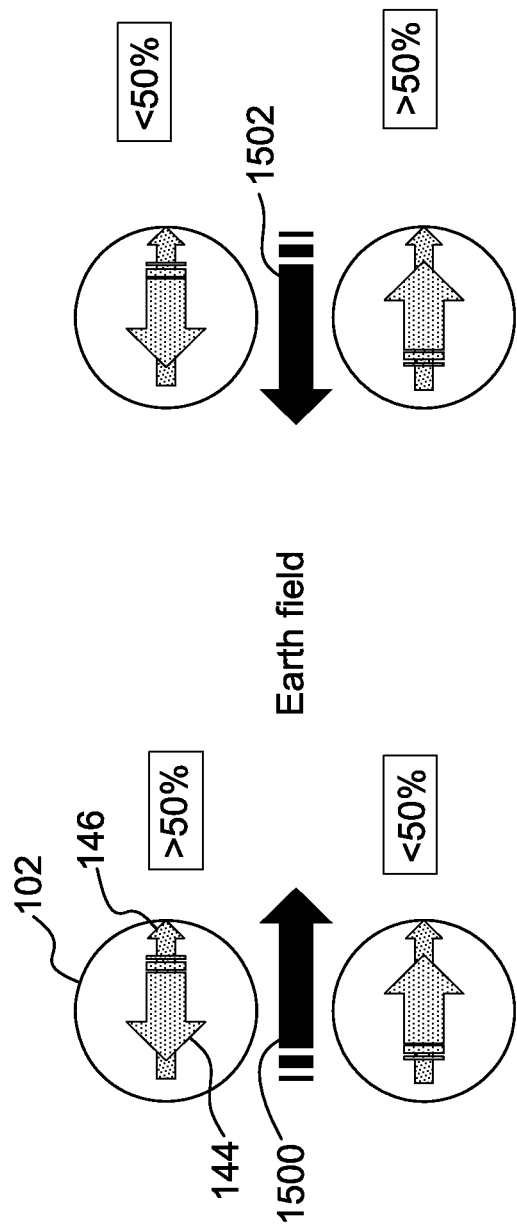
FIG. 15 illustrates storage magnetization directions and sense magnetization directions of MLU's in the presence of the Earth's magnetic field, according to an embodiment of the invention.
Figure 16:
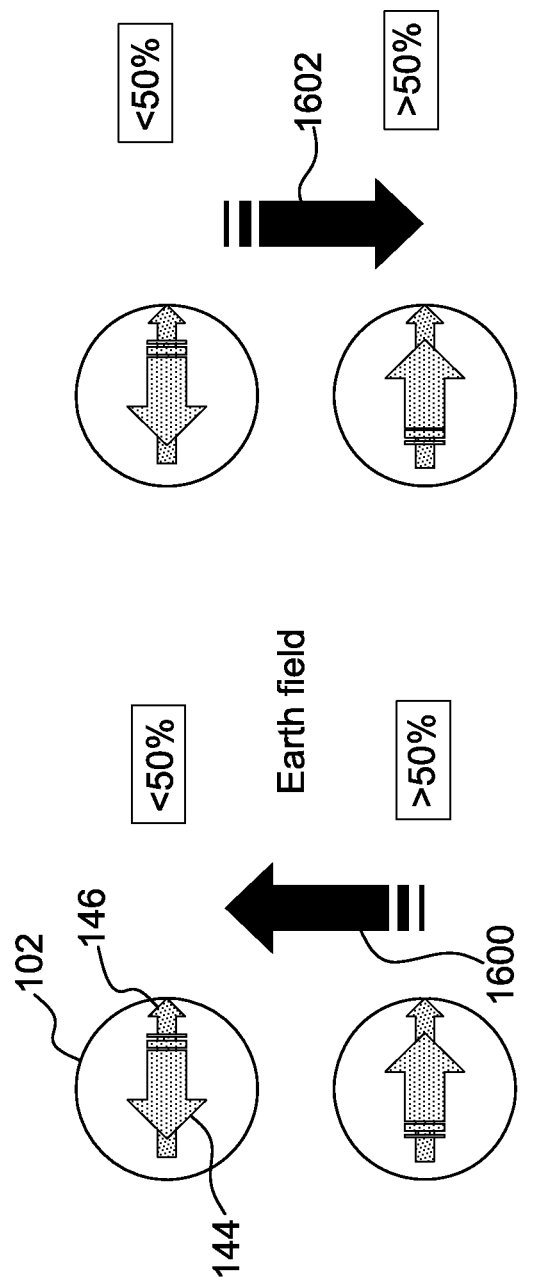
FIG. 16 illustrates storage magnetization directions and sense magnetization directions of MLU's in the presence of the Earth's magnetic field, according to an embodiment of the invention.

FIGS. 15 and 16 illustrate the storage magnetization directions 146 and the sense magnetization directions 144 of MLU's 102 in the presence of the Earth's magnetic field, according to an embodiment of the invention. In FIG. 15, a direction 1500 of the Earth's magnetic field is substantially aligned with the storage magnetization directions 146 of the MLU's 102 included in the MLU-based amplifier 200 (see FIG. 12). In this case, the magnetization of the storage layer 106 (see FIG. 1) is effectively increased, which increases the substantially anti-parallel coupling magnetization of the sense layer 104 (see FIG. 1), which increases the magnetic field (and therefore the input 130 in FIG. 12) to switch the magnetization of the sense layer 104 from substantially anti-parallel to substantially parallel to the storage magnetization direction 146. So in this case, the percentage of the MLU's 102 for which the storage magnetization direction 146 and the sense magnetization direction 144 are substantially anti-parallel is greater than 50% at the operating point 506 (see FIG. 5), and the percentage of the MLU's 102 for which the storage magnetization direction 146 and the sense magnetization direction 144 are substantially parallel is less than 50% at the operating point 506. This results in an increase in the output impedance of the MLU-based amplifier 200. In one embodiment, this results in an increase in the output signal 132, which can be a voltage measured across the MLU-based amplifier 200.

Conversely, for a direction 1502 of the Earth's magnetic field that is substantially anti-aligned with the storage magnetization directions 146 of the MLU's 102 included in the MLU-based amplifier 200, the magnetization of the storage layer 106 (see FIG. 1) is effectively decreased. In this case, the percentage of the MLU's 102 for which the storage magnetization direction 146 and the sense magnetization direction 144 are substantially anti-parallel is less than 50% at the operating point 506 (see FIG. 5), and the percentage of the MLU's 102 for which the storage magnetization direction 146 and the sense magnetization direction 144 are substantially parallel is greater than 50% at the operating point 506. This results in a decrease in the output impedance of the MLU-based amplifier 200. In one embodiment, this results in a decrease in the output signal 132, which can be a voltage measured across the MLU-based amplifier 200.

Referring to FIGS. 12, 13, and 14, pairs of MLU-based amplifiers 200 (200A and 200E; 200B and 200F; 200C and 200G; 200D and 200H) have substantially opposed storage magnetization directions 146 (see FIG. 1). Because the Earth's magnetic field is relatively small, it is advantageous to detect a differential signal that is the difference between the output signals 132 of these pairs of MLU-based amplifiers 200. For example, as shown in the examples of FIG. 15, a magnitude of this differential signal may be increased relative to the output signals 132. This can be to enhance detection of the Earth's magnetic field, and can be to suppress common mode noise (offset). Also as shown in the examples of FIG. 15, the magnitude of this differential signal may be maximized for the pair of MLU-based amplifiers 200 for which the direction of the Earth's magnetic field is substantially aligned with the storage magnetization directions 146 of the MLU's 102 included in one of the pair (and therefore substantially anti-aligned with the other of the pair). The sign of the differential signal is different for the two examples of FIG. 15.

In FIG. 16, for directions 1600 and 1602 of the Earth's magnetic field that are substantially perpendicular to the storage magnetization directions 146 of the MLU's 102 included in the MLU-based amplifier 200, the magnetization of the sense layer 104 (see FIG. 1) is slightly rotated. For both of the directions 1600 and 1602, the Earth's magnetic field may slightly decrease the magnetic field (and therefore the input 130 in FIG. 12) to switch the magnetization of the sense layer 104 from substantially anti-parallel to substantially parallel to the storage magnetization direction 146. In this case, the percentage of the MLU's 102 for which the storage magnetization direction 146 and the sense magnetization direction 144 are substantially anti-parallel may be less than 50% at the operating point 506 (see FIG. 5), and the percentage of the MLU's 102 for which the storage magnetization direction 146 and the sense magnetization direction 144 are substantially parallel may be greater than 50% at the operating point 506. This results in a decrease in the output impedance of the MLU-based amplifier 200. In one embodiment, this results in a decrease in the output signal 132, which can be a voltage measured across the MLU-based amplifier 200.

As shown in the examples of FIG. 16, the magnitude of a differential signal between a pair of MLU-based amplifiers 200 (see FIG. 12) for which the Earth's magnetic field is substantially perpendicular to the storage magnetization directions 146 (see FIG. 1) of the MLU's 102 included in the MLU-based amplifiers 200 may be approximately zero. This is because the effect of the Earth's magnetic field in the directions 1600 and 1602 on the output impedances of the pair of MLU-based amplifiers 200 may be substantially the same.

Referring to FIG. 12, the MLU-based magnetic field direction measurement device 1200 includes a sensing module 1202 configured to determine a parameter of each of the MLU-based amplifiers 200 included in the MLU-based device 1200. This parameter varies based on resistances of the MLU's 102 included in the each of the MLU-based amplifiers 200. In one embodiment, this parameter is an output impedance. In another embodiment, this parameter is a voltage and/or a current. It is contemplated that this parameter is not limited to these types, but instead may be of any type measured by the sensing module 1202 that varies in a predictable manner based on the output impedance of the MLU-based amplifiers 200.

Referring to FIG. 12, we now present an example of output voltage measurements of each of the MLU-based amplifiers 200 included in the MLU-based device 1200 by the sensing module 1202. The parameters used in this example are below:

Size of MTJ: 90 nm
TMR=100%
Rmin=4KΩ; Rav=6KΩ; Rmax=8KΩ
For each of 8 MLU-based amplifiers 200:
  Np=200; Ns=10; N=2,000; Rmin_amp=200Ω; Rav_amp=300Ω; Rmax_amp=400Ω (Rmin_amp, Rav_amp, and Rmax_amp are for 200 parallel rows of MLU's 102, with 10 MLU's 102 in series in each row)
  Input stage: Iin=25 mA (we assume 5 field lines in parallel per MLU-based amplifier 200, 5 mA per field line; each field line is across two MLU-based amplifiers 200 in series)
  Input resistance: estimated around 25Ω; Vin=0.625V
  Output stage: Vcc=3V; Icc (DC bias current 210)=10 mA; Is (DC current per row of MLU's 102)=50 µA
  Coupling magnetic field=50 Oe; earth magnetic field: 0.5 Oe or 1%
  ΔV for 1% effect: 20 mV Table 1 shows the output voltage measurements by the sensing module 1202 for the 8 MLU-based amplifiers 200 in the above example. These output voltage measurements (ΔV) are the difference between the actual output voltage across each of the MLU-based amplifiers 200 and the bias voltage Vcc of the output stage (3 Volts in this example). Differential measurements of ΔV across pairs of MLU-based amplifiers (such as MLU-based amplifiers 1 and 5 in Table 1 below) have twice the magnitude of the measurements shown in Table 1. The MLU-based amplifier 1 has a storage magnetization direction 146 (see FIG. 1) that is substantially aligned with the Earth's magnetic field. The MLU-based amplifiers 2 through 8 have storage magnetization directions 146 that are at x degrees relative to the Earth's magnetic field, as shown in Table 1.

TABLE 1

Example of voltage measurements of 8 MLU-based amplifiers 200 by the sensing module 1202

|  | 1 | 2 | 3 | 4 | 5 | 6 | 7 | 8 |
|---|---|---|---|---|---|---|---|---|
| Angle(x°) | 0 | 45 | 90 | 135 | 180 | 225 | 270 | 315 |
| ΔV (mV) | 20 | 14 | 0 | −14 | −20 | −14 | 0 | 14 |

In one embodiment, it is contemplated that an MLU-based magnetic field direction measurement device 1200 including the 8 MLU-based amplifiers 200 can be implemented in an integrated circuit having a die size of 0.125 square millimeters.

Referring to FIG. 12, the MLU-based magnetic field direction measurement device 1200 has input 130 and output 132. The input 130 may be a DC current and/or voltage for which the MLU-based amplifier 200 is substantially at the operating point 506 (see FIG. 5). In one embodiment, the input 130 does not include an additional AC signal. Alternatively, the input 130 may include an additional AC signal. A version of this additional AC signal would appear in measurements of the output 132 by the sensing module 1202.

The MLU-based device 1200 also includes a magnetic field direction determination module 1206 configured to determine an angular orientation of the MLU-based device 1200 relative to the external magnetic field based on the parameter (such as the output impedance, output voltage, or output current) of each of the MLU-based amplifiers 200. The magnetic field direction determination module 1206 may be configured to determine the angular orientation of the MLU-based device 1200 relative to the external magnetic field in three dimensions based on Hall effect vertical axis sensing. In one embodiment, the magnetic field direction determination module 1206 may determine a direction of the external magnetic field based on the output 132. The output 132 may include an amplified AC signal if the input 130 includes a version of AC signal. This AC signal may be filtered to extract noise, and may facilitate determination of the direction of the external magnetic field by the magnetic field direction determination module 1206. Alternatively, the output 132 may be only a DC signal.

The MLU-based device 1200 also includes a control module 1204. The control module 1204 may measure the output impedance of each MLU-based amplifier 200 (or alternatively may measure the output 132 and obtain the output impedance based on the output 132). The control module may adjust the input signal 130 such that the MLU-based amplifiers 200 are each set at an operating point at the midpoint 506 of the substantially linear region 510 of the I-V response curve (see FIG. 5). At the midpoint 506, the device sensitivity may be at its maximum. In one embodiment, the control module 1204 also compensates for temperature variations and other effects that may cause the operating point to drift from the midpoint 506. The control module 1204 may be implemented through a complementary metal oxide semiconductor (CMOS) process.

In one embodiment, the control module 1204 may control a switch 1208 (such as a transistor) that can turn the DC bias current 210 to the MLU amplification module 100 on or off. Power can be saved by turning on the DC bias current 210 only when needed for the MLU-based device 1200 to measure the direction of the external magnetic field. In the example of Table 1, for each of the MLU-based amplifiers 200, the power consumption is based on the following parameters:

Output: Vcc=3V Icc (DC bias current 210)=20 mA for 20 ns

Input: Vin=0.625V Iin (input signal 130)=25 mA for 20 ns

In the example of Table 1, the DC bias current 210 is applied for 20 nanoseconds, during which the sensing module 1202 can perform measurements of the output 132. Similarly, the input signal 130 can be applied for 20 nanoseconds. The control module 1204 may turn the input signal 130 on and off in a similar manner to that shown in FIG. 12 for the DC bias current 210.

In one embodiment, the sensing module 1202 may determine the input impedance, voltage, and/or current of each MLU-based amplifier 200 (or alternatively may measure the input 130 and obtain the input impedance, voltage, and/or current based on the input 130). The sensing module 1202 may extract minimum and maximum values of the input impedance, voltage, and/or current of each MLU-based amplifier 200.

From these measurements, the magnetic field determination module 1206 determines the angular orientation of the MLU-based device 1200 relative to magnetic North. In one embodiment, the magnetic field direction determination module 1206 may estimate this angular orientation based on these measurements, such as through interpolation or other algorithms.

The MLU-based device 1200 can operate with MLU's 102 that are not linear due to hysteresis. In one embodiment, the control logic 1204 increases the input 130 regularly (such as periodically) to measure the output impedance of each MLU-based amplifier 200 at the midpoint 506 (see FIG. 5). Since the measurements are occurring while the input 130 is increasing, hysteresis that results when the input 130 is decreasing does not affect the MLU-based device 1200. Alternatively, the control logic 1204 can decrease the input 130 regularly to measure the output impedance of each MLU-based amplifier 200 at the midpoint 506 (see FIG. 5). In this embodiment, since the measurements are occurring while the input 130 is decreasing, hysteresis that results when the input 130 is increasing does not affect the MLU-based device 1200.

The MLU-based device 1200 can also operate with MLU-based amplifiers 200 that have different impedances. Each MLU-based amplifier 200 can include large numbers of MLU's 102 connected together, such as several thousand MLU's 102. Due to manufacturing and process imperfections, about 0.5% of the MLU's 102 may be shorted, open, or may have size variations relative to other MLU's 102. As a result, there will be an offset between the different impedances of two theoretically matched MLU-based amplifiers 200 (from which a differential signal may be generated, as described previously). If the impedance mismatch resulting from manufacturing and process imperfections of these two MLU-based amplifiers 200 is about 1%, the resulting variation in the output signals 132 of the two MLU-based amplifiers 200 may be as large as the variation in the output signals 132 due to the Earth's magnetic field. It is therefore advantageous to compensate for this offset.

In one embodiment, the offset can be compensated for through two measurements of the pair of MLU-based amplifiers 200. First, an offset determination module 1210 (see FIG. 12) included in the magnetic field determination module 1208 determines the impedance offset between the MLU-based amplifiers 200 at zero input 130. At zero input current, the MLU's 102 included in the MLU-based amplifiers 200 are substantially anti-aligned. The offset between the impedances of the MLU-based amplifiers 200 at zero input current is $\Delta V_o$. Second, the offset determination module 1210 determines the impedance offset $\Delta V_c$ between the MLU-based amplifiers 200 at the input 130 corresponding to the midpoint 506 of the substantially linear portion 510 of the I-V response curve (see FIG. 5). With a TMR of 100%, the resistance at the midpoint 506 may be ⅔ of the resistance with zero input current. As a result, without the Earth's magnetic field:

$$\Delta V_c = (\tfrac{2}{3}) \times \Delta V_0 \tag{8}$$

Combined with the effect of the Earth's magnetic field:

$$\Delta V_c = \Delta V_{earth} + (\tfrac{2}{3}) \times \Delta V_0 \tag{9}$$

Altogether the offset in the measurement of the differential voltage caused by the Earth's magnetic field is:

$$\Delta V_{earth} = \Delta V_c - \tfrac{2}{3} \Delta V_0 \tag{10}$$

Therefore, by adjusting the parameters of the MLU-based amplifiers 200 based on this offset determined from the two above-described measurements, the angular orientation of the MLU-based device 1200 relative to an external magnetic field can be determined accurately in the presence of impedance mismatches between the MLU-based amplifiers 200. The MLU-based device 1200 may store this offset for each pair of MLU-based amplifiers 200.

There may be other types of mismatches between MLU-based amplifiers 200 included in the MLU-based device 1200 (see FIG. 12). Approaches for compensating for these mismatches may include: (1) increasing the number of MLU's 102 included in each MLU-based amplifier 200 to take advantage of additional averaging of characteristics of the MLU's 102; (2) using multiple field lines; and (3) performing initial measurements of the characteristics of each MLU-based amplifier 200 at final test to determine a compensation factor associated with each MLU-based amplifier 200.

In one embodiment, there may be additional ways of enhancing the performance of the MLU-based device 1200. These may include: (1) lowering the coupling field between the storage layer 106 (see FIG. 1) and the sense layer 104 by modifying device characteristics of the MLU's 102 to increase the sensitivity of the MLU-based device 1200 to external magnetic fields; (2) increase TMR, again by modifying device characteristics of the MLU's 102, to increase the sensitivity of the MLU-based device 1200 to external magnetic fields; (3) increase the number of MLU-based amplifiers 200 included in the MLU-based device 1200 (for example, 36 MLU-based amplifiers 200 with storage magnetization directions 146 spaced by 10 degrees). This offers a greater number of readings to enhance the signal to noise ratio; and (4) perhaps reduce the cladding of the field line(s) so that the Earth's magnetic field is not partially shielded.

Referring to FIG. 12, in one embodiment, a module (not shown) may be configured to store configuration values to compensate for temperature drift and to increase linearity of at least one of the MLU-based amplifiers 200. This module may be included in the control module 1204, or alternatively may be included in the magnetic field determination module 1206.

Referring to FIG. 12, in one embodiment, a module (not shown) may be configured to store configuration values to compensate for at least one of parallax errors and magnetic offsets. This module may be included in the control module 1204, or alternatively may be included in the magnetic field determination module 1206. The magnetic field direction determination module 1206 may be configured to determine the angular orientation of the MLU-based device 1200 relative to the external magnetic field based on the configuration values. At least one of the parallax errors and the magnetic offsets may result from other external magnetic fields. The module may be configured to select the configuration values for the magnetic field direction determination module 1206 based on a location of the MLU-based device 1200. This location information may be based on Global Positioning System (GPS) data.

Referring to FIG. 12, in one embodiment, a module (not shown) may be configured to store configuration values to compensate for linearity offsets resulting from at least one of slope differences, DC offsets, and angle offsets across the MLU-based amplifiers 200. In addition, referring to FIG. 12, in one embodiment, a module (not shown) may be configured to store configuration values to compensate for interpolation errors across the MLU-based amplifiers 200. This module may be included in the control module 1204, or alternatively may be included in the magnetic field determination module 1206.

Figure 17:
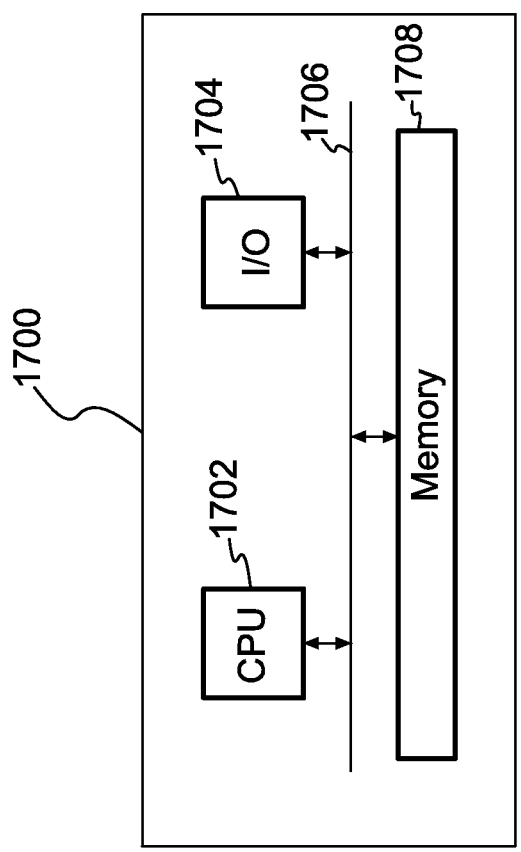
FIG. 17 illustrates an apparatus configured in accordance with one embodiment of the present invention.

FIG. 17 illustrates an apparatus 1700 configured in accordance with one embodiment of the present invention. The apparatus includes a central processing unit (CPU) 1702 connected to a bus 1706. Input/output devices 1704 may also be connected to the bus 1706, and may include a keyboard, mouse, display, and the like. An executable program representing a magnetic field direction determination module 1206 (see FIG. 12) as described above is stored in memory 1708. Executable programs representing other modules included in the MLU-based device 1200 can also be stored in the memory 1708.

An embodiment of the invention relates to a computer-readable storage medium having computer code thereon for performing various computer-implemented operations. The term "computer-readable storage medium" is used herein to include any medium that is capable of storing or encoding a sequence of instructions or computer codes for performing the operations described herein. The media and computer code may be those specially designed and constructed for the purposes of the invention, or they may be of the kind well known and available to those having skill in the computer software arts. Examples of computer-readable storage media include, but are not limited to: magnetic media such as hard disks, floppy disks, and magnetic tape; optical media such as CD-ROMs and holographic devices; magneto-optical media such as floptical disks; and hardware devices that are specially configured to store and execute program code, such as application-specific integrated circuits ("ASICs"), programmable logic devices ("PLDs"), and ROM and RAM devices. Examples of computer code include machine code, such as produced by a compiler, and files containing higher-level code that are executed by a computer using an interpreter or a compiler. For example, an embodiment of the invention may be implemented using Java, C++, or other object-oriented programming language and development tools. Additional examples of computer code include encrypted code and compressed code. Moreover, an embodiment of the invention may be downloaded as a computer program product, which may be transferred from a remote computer (e.g., a server computer) to a requesting computer (e.g., a client computer or a different server computer) via a transmission channel. Another embodiment of the invention may be implemented in hardwired circuitry in place of, or in combination with, machine-executable software instructions.

While the invention has been described with reference to the specific embodiments thereof, it should be understood by those skilled in the art that various changes may be made and equivalents may be substituted without departing from the true spirit and scope of the invention as defined by the appended claims. In addition, many modifications may be made to adapt a particular situation, material, composition of matter, method, or process to the objective, spirit and scope of the invention. All such modifications are intended to be within the scope of the claims appended hereto. In particular, while the methods disclosed herein have been described with reference to particular operations performed in a particular order, it will be understood that these operations may be combined, sub-divided, or re-ordered to form an equivalent method without departing from the teachings of the invention. Accordingly, unless specifically indicated herein, the order and grouping of the operations are not limitations of the invention.

What is claimed is:

1. An apparatus, comprising:
a plurality of circuits, each of the plurality of circuits having a distinct angular orientation and including multiple magnetic tunnel junctions, each magnetic tunnel junction being configured such that a resistance of each magnetic tunnel junction varies in response to a magnetic field; and
a field line configured to generate a magnetic field for configuring an operating point of each of the plurality of circuits based on a current flow through the field line, wherein the field line includes a plurality of portions, each of the plurality of portions disposed adjacent to a corresponding one of the plurality of circuits, and each of the plurality of portions being configured such that the current flow through each of the plurality of portions has an angular orientation corresponding to the distinct angular orientation of the corresponding one of the plurality of circuits; wherein:
each magnetic tunnel junction includes a storage layer having a storage magnetization and a sense layer having a sense magnetization; and
the operating point of each of the plurality of circuits is configured such that for a first subset of the multiple magnetic tunnel junctions, the sense magnetization is substantially aligned with the storage magnetization at the operating point, and for a second subset of the multiple magnetic tunnel junctions, the sense magnetization is substantially anti-aligned with the storage magnetization at the operating point.

2. The apparatus of claim 1, wherein the second subset is a remaining subset of the multiple magnetic tunnel junctions.

3. The apparatus of claim 1, wherein:
each of the plurality of circuits has an average storage magnetization direction based on the storage magnetizations of the multiple magnetic tunnel junctions included in each of the plurality of circuits; and
the operating point of each of the plurality of circuits is configurable such that the parameter of each of the plurality of circuits is substantially insensitive to a component of the external magnetic field that is substantially perpendicular to the average storage magnetization direction.

4. The apparatus of claim 1, wherein:
the magnetic field is a first magnetic field; and
the field line is configured to generate a second magnetic field for configuring the storage magnetization of each of the multiple magnetic tunnel junctions included in each of the plurality of circuits.

5. The apparatus of claim 1, wherein the angular orientations of the plurality of portions of the field line are substantially equally spaced.

6. The apparatus of claim 1, wherein:
the plurality of portions of the field line includes N portions, wherein N is at least three; and
the angular orientations of the plurality of portions of the field line are substantially equally spaced by an angle of 360 degrees divided by N.

7. The apparatus of claim 1, wherein:
each of the plurality of circuits has an average storage magnetization direction based on the storage magnetizations of the multiple magnetic tunnel junctions included in each of the plurality of circuits; and
the average storage magnetization directions of the plurality of circuits are substantially equally spaced.

8. The apparatus of claim 1, wherein:
each of the plurality of circuits has an average storage magnetization direction based on the storage magnetizations of the multiple magnetic tunnel junctions included in each of the plurality of circuits;
the plurality of circuits includes N circuits, wherein N is at east three; and
the average storage magnetization directions of the N circuits are substantially equally spaced by an angle of 360 degrees divided by N.

9. The apparatus of claim 1, wherein:
the plurality of portions of the field line include a first portion and a second portion; and
the current flow through the first portion is in a substantially opposite direction to the current flow through the second portion.

10. The apparatus of claim 1, wherein the field line is serpentine.

11. The apparatus of claim 1, wherein a width of the field line is configured for input impedance matching.

12. The apparatus of claim 1, wherein:
the field line has a first lateral edge, a second lateral edge opposite the first lateral edge, and a first end;
at least a portion of each of the multiple magnetic tunnel junctions is disposed between the first lateral edge and the second lateral edge of the field line; and
each of the multiple magnetic tunnel junctions is disposed substantially the same distance from the first end of the field line.

13. The apparatus of claim 1, wherein:
the multiple magnetic tunnel junctions included in each of the plurality of circuits are arranged in a plurality of rows;
the magnetic tunnel junctions in each of the plurality of rows are connected in series; and
the plurality of rows are connected in parallel.

14. The apparatus of claim 1, wherein the field line is a single field line.

15. The apparatus of claim 1, wherein the field line is a first field line, the magnetic field is a first magnetic field, and the current flow is a first current flow, and further comprising a second field line connected in parallel with the first field tine, wherein the second field line is configured to generate a second magnetic field for configuring the operating point of each of the plurality of circuits based on a second current flow through the second field line.

16. The apparatus of claim 1, further comprising a module configured to determine an external magnetic. field based on a parameter of each of the plurality of circuits, wherein the parameter of each of the plurality of circuits varies based on a combined resistance of the multiple magnetic tunnel junctions, the module being implemented in at least one of a memory or a processing device.

17. The apparatus of claim 16, further comprising a first circuit including multiple magnetic tunnel junctions, wherein:
the plurality of circuits includes a second circuit; and the module is configured to determine the external magnetic field based on a differential signal, the differential signal being a difference between a first output signal of the first circuit and a second output signal of the second circuit, wherein a magnitude of the differential signal is increased relative to the first output signal and the second output signal to enhance detection of the external magnetic field.

18. The apparatus of claim 17, wherein the apparatus is configured to generate the differential signal for suppression of common mode noise.

19. The apparatus of claim 1, further comprising a first circuit including multiple magnetic tunnel junctions, wherein:
 the plurality of circuits includes a second circuit;
 each magnetic tunnel junction includes a storage layer having a storage magnetization;
 each of the first circuit and the second circuit has an average storage magnetization direction based on the storage magnetizations of the multiple magnetic tunnel junctions included in each of the first circuit and the second circuit;
 the magnetic field is a first magnetic field; and
 the field line is configured to generate a second magnetic field for configuring each of the storage magnetizations of the multiple magnetic tunnel junctions included in each of the first circuit and the second circuit such that the average storage magnetization direction of the first circuit is substantially anti-aligned with the average storage magnetization direction of the second circuit.

20. The apparatus of claim 19, wherein the apparatus is configured to generate a differential signal, the differential signal being a difference between a first output signal of the first circuit and a second output signal of the second circuit, wherein a magnitude of the differential signal is increased relative to the first output signal and the second output signal.

21. The apparatus of claim 20, wherein the apparatus is configured to generate the differential signal for suppression of common mode noise.

22. The apparatus of claim 1, wherein the operating point of each of the plurality of circuits is configured to substantially maximize gain of the corresponding one of the plurality of circuits.

23. The apparatus of claim 1, wherein the operating point of each of the plurality of circuits is configured to maintain substantially linear operation of the corresponding one of the plurality of circuits.

* * * * *